(12) United States Patent
Lu et al.

(10) Patent No.: US 10,756,208 B2
(45) Date of Patent: Aug. 25, 2020

(54) INTEGRATED CHIP AND METHOD OF FORMING THE SAME

(71) Applicant: Taiwan Semiconductor Manufacturing Co., Ltd., Hsin-Chu (TW)

(72) Inventors: Hui-Ting Lu, Zhudong Township (TW); Pei-Lun Wang, Zhubei (TW); Yu-Chang Jong, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/174,626

(22) Filed: Oct. 30, 2018

(65) Prior Publication Data

US 2019/0088777 A1  Mar. 21, 2019

Related U.S. Application Data

(60) Continuation-in-part of application No. 15/927,281, filed on Mar. 21, 2018, now Pat. No. 10,636,904, (Continued)

(51) Int. Cl.
*H01L 29/78* (2006.01)
*H01L 29/40* (2006.01)
(Continued)

(52) U.S. Cl.
CPC ........ *H01L 29/7816* (2013.01); *H01L 21/761* (2013.01); *H01L 23/485* (2013.01);
(Continued)

(58) Field of Classification Search
CPC .......... H01L 29/7816; H01L 29/66681; H01L 29/402; H01L 29/407
See application file for complete search history.

(56) References Cited

U.S. PATENT DOCUMENTS 4,288,803 A  9/1981 Ronen
4,290,077 A  9/1981 Ronen
(Continued)

OTHER PUBLICATIONS

Knaipp, et al. "Investigations on an Isolated Lateral High-Voltage n-channel LDMOS Transistor with a Typical Breakdown of 150V." Proceeding of the 36th European Solid-State Device Research Conference, 2006. ESSDERC 2006. Sep. 2006.
(Continued)

*Primary Examiner* — Michele Fan
(74) *Attorney, Agent, or Firm* — Eschweiler & Potashnik, LLC

(57) ABSTRACT

The present disclosure relates to an integrated chip. In some embodiments, the integrated chip has a gate structure disposed over a substrate between source and drain regions and a dielectric layer laterally extending from over the gate structure to between the gate structure and the drain region. A composite etch stop layer having a plurality of different dielectric materials is stacked over the dielectric layer. A contact etch stop layer directly contacts an upper surface and sidewalls of the composite etch stop layer. A field plate is laterally surrounded by a first inter-level dielectric (ILD) layer and vertically extends from a top of the first ILD layer, through the contact etch stop layer, and into the composite etch stop layer.

20 Claims, 18 Drawing Sheets

Related U.S. Application Data which is a division of application No. 15/424,333, filed on Feb. 3, 2017, now Pat. No. 9,954,097, which is a continuation of application No. 14/604,885, filed on Jan. 26, 2015, now Pat. No. 9,590,053.

(60) Provisional application No. 62/084,038, filed on Nov. 25, 2014.

(51) Int. Cl.

| | | |
|---|---|---|
| *H01L 23/495* | (2006.01) | |
| *H01L 29/66* | (2006.01) | |
| *H01L 21/761* | (2006.01) | |
| *H01L 29/417* | (2006.01) | |
| *H01L 23/485* | (2006.01) | |
| *H01L 29/10* | (2006.01) | |
| *H01L 29/06* | (2006.01) | |

(52) U.S. Cl.
CPC .. *H01L 23/49562* (2013.01); *H01L 23/49575* (2013.01); *H01L 29/402* (2013.01); *H01L 29/407* (2013.01); *H01L 29/4175* (2013.01); *H01L 29/66659* (2013.01); *H01L 29/66681* (2013.01); *H01L 29/66689* (2013.01); *H01L 29/78* (2013.01); *H01L 29/7835* (2013.01); *H01L 29/0653* (2013.01); *H01L 29/0692* (2013.01); *H01L 29/1045* (2013.01); *H01L 29/1087* (2013.01); *H01L 29/665* (2013.01)

(56) References Cited

U.S. PATENT DOCUMENTS

| | | | |
|---|---|---|---|
| 5,362,979 | A | 11/1994 | Merchant |
| 5,374,843 | A | 12/1994 | Williams et al. |
| 5,625,217 | A | 4/1997 | Chau et al. |
| 5,831,320 | A | 11/1998 | Kwon et al. |
| 6,160,290 | A | 12/2000 | Pendharkar et al. |
| 6,465,845 | B1 | 10/2002 | Baek |
| 8,173,510 | B2 | 5/2012 | Denison et al. |
| 9,590,053 | B2 | 3/2017 | Chou et al. |
| 9,871,132 | B1* | 1/2018 | Liu .............. H01L 29/7816 |
| 9,954,097 | B2 | 4/2018 | Chou et al. |
| 2002/0145172 | A1 | 10/2002 | Fujishima et al. |
| 2002/0182810 | A1 | 12/2002 | Oh |
| 2005/0020021 | A1 | 1/2005 | Fujiwara et al. |
| 2005/0110042 | A1 | 5/2005 | Saito et al. |
| 2005/0156234 | A1 | 7/2005 | Gammel et al. |
| 2006/0113601 | A1 | 6/2006 | Shibib et al. |
| 2006/0113625 | A1 | 6/2006 | Bude et al. |
| 2007/0114608 | A1 | 5/2007 | Letavic |
| 2007/0152343 | A1* | 7/2007 | Richter ............ H01L 21/76832 257/774 |
| 2007/0167010 | A1 | 7/2007 | Furusawa et al. |
| 2007/0278568 | A1 | 12/2007 | Williams et al. |
| 2008/0182394 | A1 | 7/2008 | Yang et al. |
| 2008/0283844 | A1 | 11/2008 | Shinichi |
| 2009/0242937 | A1 | 10/2009 | Marui |
| 2012/0228704 | A1 | 9/2012 | Ju |
| 2012/0264279 | A1* | 10/2012 | Lu ................. H01L 29/4966 438/585 |
| 2012/0319182 | A1* | 12/2012 | Satoh ................ H01L 29/78 257/288 |
| 2013/0020625 | A1* | 1/2013 | Shih ................. H01L 29/42324 257/315 |
| 2013/0134512 | A1 | 5/2013 | Cheng et al. |
| 2014/0061659 | A1* | 3/2014 | Teplik .............. H01L 29/402 257/76 |
| 2014/0264556 | A1 | 9/2014 | Lai et al. |
| 2014/0361342 | A1 | 12/2014 | Sriram et al. |
| 2014/0367778 | A1 | 12/2014 | Sharma et al. |
| 2015/0048447 | A1* | 2/2015 | Sharma .............. H01L 29/7816 257/337 |
| 2015/0179782 | A1 | 6/2015 | Yamamura |
| 2015/0380487 | A1 | 12/2015 | Yoshida et al. |
| 2016/0149007 | A1 | 5/2016 | Chou et al. |
| 2016/0190297 | A1 | 6/2016 | Kudymov et al. |
| 2017/0352731 | A1 | 12/2017 | Kuo et al. |
| 2018/0219093 | A1 | 8/2018 | Chou et al. |
| 2019/0288066 | A1* | 9/2019 | Lee ................. H01L 29/402 |
| 2019/0288112 | A1* | 9/2019 | Wang .............. H01L 29/66659 |

OTHER PUBLICATIONS

Non-Final Office Action dated May 23, 2016 for U.S. Appl. No. 14/604,885.
Notice of Allowance dated Oct. 25, 2016 for U.S. Appl. No. 14/604,885.
Non-Final Office Action dated Jul. 17, 2017 for U.S. Appl. No. 15/424,333.
Notice of Allowance dated Dec. 20, 2017 for U.S. Appl. No. 15/424,333.
Non-Final Office Action dated Oct. 23, 2018 for U.S. Appl. No. 15/927,281.
Final Office Action dated Apr. 8, 2019 for U.S. Appl. No. 15/927,281.
Notice of Allowance dated Dec. 18, 2019 in connection with U.S. Appl. 15/927,281.
Non-Final Office Action dated Oct. 7, 2019 in connection with U.S. Appl. No. 15/927,281.

* cited by examiner

INTEGRATED CHIP AND METHOD OF FORMING THE SAME

REFERENCE TO RELATED APPLICATIONS

This Application is a Continuation-in-Part of U.S. application Ser. No. 15/927,281, filed on Mar. 21, 2018, which is a Divisional of U.S. application Ser. No. 15/424,333, filed on Feb. 3, 2017 (now U.S. Pat. No. 9,954,097, issued on Apr. 24, 2018), which is a Continuation of U.S. application Ser. No. 14/604,885, filed on Jan. 26, 2015 (now U.S. Pat. No. 9,590,053, issued on Mar. 7, 2017), which claims priority to U.S. Provisional Application No. 62/084,038, filed on Nov. 25, 2014. The contents of the above-referenced Patent Applications are hereby incorporated by reference in their entirety.

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers in RF transmission/receiving chains due to their ability to handle high breakdown voltages (e.g., greater than about 50V) and high frequencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
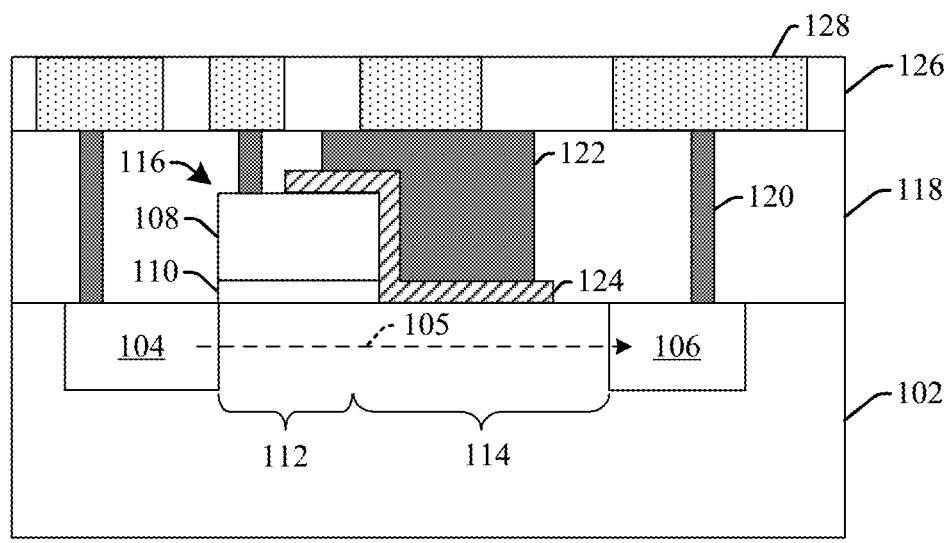
FIG. 1 illustrates a cross-sectional view of some embodiments of a disclosed high voltage transistor device having a field plate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High voltage transistor devices are often constructed to have field plates. Field plates are conductive elements, which are placed over a channel region to enhance the performance of a high voltage transistor device by manipulating electric fields (e.g., reducing peak electric fields) generated by a gate electrode. By manipulating the electric field generated by the gate electrode, the high voltage transistor device can achieve higher breakdown voltages. For example, LDMOS (laterally diffused metal oxide semiconductor) transistor devices often comprise field plates that extend from a channel region to an adjacent drift region disposed between the channel region and a drain region.

Field plates can be formed in a number of different ways. For example, field plates may be formed by extending a conductive gate material (e.g., polysilicon) from a gate electrode towards a drift region. However, in such configurations the field plate is synchronized to a gate bias, which burdens the gate-to-drain capacitance ($C_{gd}$) and worsens the switching losses of the device. Alternatively, the conductive gate material can be patterned to form a separate field plate. Such configurations reduce the gate-to-drain capacitance ($C_{gd}$), but placement of the field plates are often restricted by design rules. In yet another alternative, non-gate materials can be used for field plate formation. However, such solutions use additional processing steps that increase the fabrication cost of a resulting integrated chip.

Accordingly, the present disclosure relates to a high voltage transistor device having a field plate made from non-gate materials, which is formed concurrent with a formation of a back-end-of-the-line (BEOL) metal layer to enable a low-cost method of fabrication. In some embodiments, the high voltage transistor device has a gate electrode disposed over a substrate between a source region and a drain region located within the substrate. A dielectric layer laterally extends from over the gate electrode to a drift region arranged between the gate electrode and the drain region. A field plate is located within a first inter-level dielectric (ILD) layer overlying the substrate. The field plate laterally extends from over the gate electrode to over the drift region and vertically extends from the dielectric layer to a top surface of the first ILD layer. A plurality of metal contacts, having a same material as the field plate, vertically extend from a bottom surface of the first ILD layer to a top surface of the first ILD layer.

FIG. 1 illustrates a cross-sectional view of some embodiments of a disclosed high voltage transistor device 100 having a field plate 122.

The high voltage transistor device 100 comprises a source region 104 and a drain region 106 disposed within a semiconductor substrate 102. The semiconductor substrate 102 has a first doping type, while the source region 104 and the drain region 106 have a second doping type, with a higher doping concentration than the semiconductor substrate 102. In some embodiments, the first doping type may by an n-type doping and the second doping type may be a p-type doping.

A gate structure 116 is disposed over the semiconductor substrate 102 at a position that is laterally arranged between the source region 104 and the drain region 106. The gate structure 116 comprises gate electrode 108 that is separated from the semiconductor substrate 102 by a gate dielectric layer 110. Upon receiving a bias voltage, the gate electrode 108 is configured to generate an electric field that controls the movement of charge carriers within a channel region 112 laterally disposed between the source region 104 and the drain region 106. For example, during operation, a gate-source voltage ($V_{GS}$) can be selectively applied to the gate electrode 108 relative to the source region 104, forming a conductive channel in the channel region 112. While $V_{GS}$ is applied to form the conductive channel, a drain to source voltage ($V_{DS}$) is applied to move charge carriers (e.g., shown by arrow 105) between the source region 104 and the drain region 106.

The channel region 112 laterally extends from the source region 104 to an adjacent drift region 114 (i.e., a drain extension region). The drift region 114 comprises a second doping type having a relatively low doping concentration, which provides for a higher resistance at high operating voltages. The gate structure 116 is disposed over the channel region 112. In some embodiments, the gate structure 116 may extend from over the channel region 112 to a position overlying a portion of the drift region 114.

A first inter-level dielectric (ILD) layer 118 is disposed over the semiconductor substrate 102. One or more conductive metal structures are disposed within the first ILD layer 118. In some embodiments, the one or more conductive metal structures comprise a plurality of contacts 120 configured to provide for a vertical connection between the source region 104, the drain region 106, or the gate electrode 108 and a first back-end-of-the-line (BEOL) metal wire layer 128 disposed within a second ILD layer 126 overlying the first ILD layer 118.

The one or more conductive metal structures may further comprise a field plate 122 disposed within the first ILD layer 118 at a position overlying portions of the gate electrode 108 and the drift region 114. The field plate 122 comprises a same conductive material as the plurality of contacts 120. The field plate 122 may be disposed over a dielectric layer 124 configured to separate the field plate 122 from the drift region 114 and the gate electrode 108. In some embodiments, the dielectric layer 124 laterally extends past the field plate 122 in one or more directions.

During operation, the field plate 122 is configured to act upon the electric field generated by the gate electrode 108. The field plate 122 may be configured to change distribution of the electric field generated by the gate electrode 108 in the drift region 114, which enhances the internal electric field of the drift region 114 and increases the drift doping concentration of the drift region 114, thereby enhancing the breakdown voltage capability of the high voltage transistor device 100.

Figure 2:
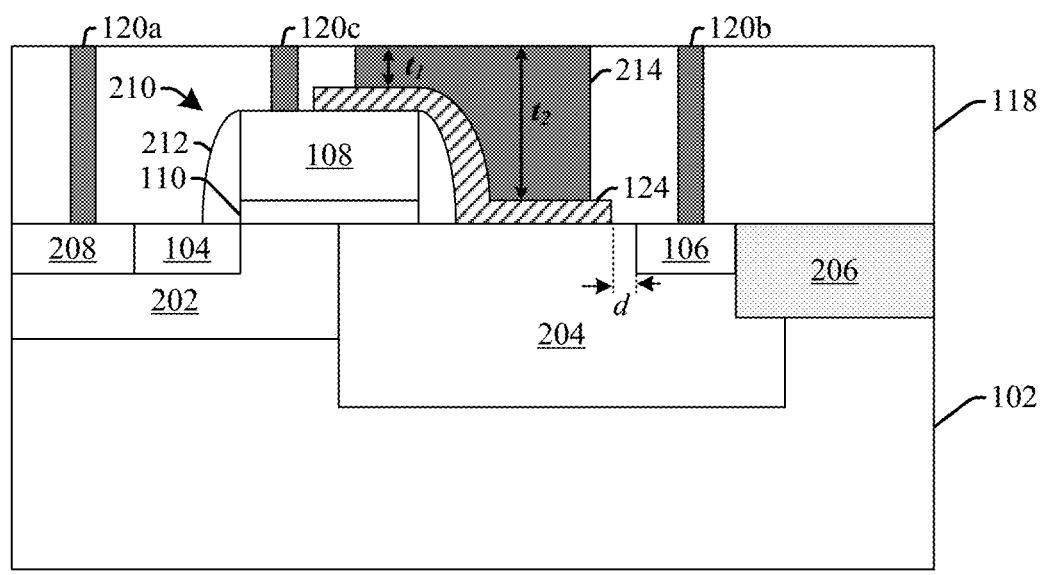
FIGS. 2-4 illustrate cross-sectional views of some additional embodiments of disclosed high voltage laterally diffused MOSFET (LDMOS) devices having a field plate.

FIG. 2 illustrates a cross-sectional view of some additional embodiments of disclosed high voltage transistor device comprising a high voltage laterally diffused MOSFET (LDMOS) device 200 having a field plate 214.

The LDMOS device 200 comprises a source region 104 and a drain region 106 disposed within a semiconductor substrate 102. The semiconductor substrate 102 has a first doping type, while the source region 104 and the drain region 106 comprise highly doped regions having a second doping type different than the first doping type. In some embodiments, the first doping type may be p-type and the second doping type may be n-type. In some embodiments, the source region 104 and the drain region 106 may have doping concentrations that are in a range of between approximately $10^{19}$ cm$^{-3}$ and approximately $10^{20}$ cm$^{-3}$.

A contact region 208 (e.g., a 'p-tap' or an 'n-tap') having the first doping type (e.g., a p+ doping) laterally abuts the source region 104. The contact region 208 provides for an ohmic connection to the semiconductor substrate 102. In some embodiments, the contact region 208 may have a p-type doping concentration that is in a range of between approximately $10^{18}$ cm$^{-3}$ and approximately $10^{20}$ cm$^{-3}$. The contact region 208 and the source region 104 are disposed within a body region 202. The body region 202 has the first doping type with a doping concentration that is higher than that of the semiconductor substrate 102. For example, the semiconductor substrate 102 may have a doping concentration that is in a range of between approximately $10^{14}$ cm$^{-3}$ and approximately $10^{16}$ cm$^{-3}$, while the body region 202 may have a doping concentration that is in a range of between approximately $10^{16}$ cm$^{-3}$ and approximately $10^{18}$ cm$^3$.

The drain region 106 is disposed within a drift region 204 that is arranged within the semiconductor substrate 102 at a position laterally abutting the body region 202. The drift region 204 comprises a second doping type having a relatively low doping concentration, which provides for a higher resistance when the LDMOS device 200 is operated at a high voltage. In some embodiments, the drift region 204 may have a doping concentration that is in a range of between approximately $10^{15}$ cm$^{-3}$ and approximately $10^{17}$ cm$^{-3}$.

A gate structure 210 is disposed over the semiconductor substrate 102 at a position that is laterally arranged between the source region 104 and the drain region 106. In some embodiments, the gate structure 210 may laterally extend from over the body region 202 to a position overlying a portion of the drift region 204. The gate structure 210 comprises a gate electrode 108 that is separated from the semiconductor substrate 102 by a gate dielectric layer 110. In some embodiments, the gate dielectric layer 110 may comprise silicon dioxide (SiO$_2$) or a high-k gate dielectric material and the gate electrode 108 may comprise polysilicon or a metal gate material (e.g., aluminum). In some embodiments, the gate structure 210 may also comprise sidewall spacers 212 disposed on opposing sides of the gate electrode 108. In various embodiments, the sidewall spacers 212 may comprise a nitride based sidewall spacer (e.g., comprising SiN) or an oxide-based sidewall spacer (e.g., SiO$_2$, SiOC, etc.).

One or more dielectric layers 124 are disposed over the gate electrode 108 and the drift region 204. In some embodiments, the one or more dielectric layers 124 continuously extend from over a portion of the gate electrode 108 to over a portion of the drift region 204. In some embodiments, the one or more dielectric layers 124 may be conformally disposed onto the drift region 204, the gate electrode 108, and the sidewall spacers 212.

A field plate 214 is disposed over the one or more dielectric layers 124 and is laterally surrounded by a first ILD layer 118. The field plate 214 extends from over the gate electrode 108 to over the drift region 204. The size of the field plate 214 may vary depending on the size and characteristics of the LDMOS device 200. In some embodiments, the field plate 214 may have a size that is between approximately 50 nanometers and approximately 1 um. In other embodiments, the field plate 214 may be larger or smaller. In some embodiments, the first ILD layer 118 may comprise a dielectric material having a relatively low dielectric constant (e.g., less than or equal to approximately 3.9), which provides for electrical isolation between the plurality of contacts 120 and/or the field plate 122. In some embodiments, the first ILD layer 118 may comprise an ultra-low k dielectric material or a low-k dielectric material (e.g., SiCO).

The field plate 214 vertically extends from the dielectric layer 124 to a top surface of the first ILD layer 118. In some embodiments, the field plate 214 may vertically extend to a height that is greater than or equal to a height of top surfaces of the contacts 120 and the first ILD layer 118. The field plate 122 has a non-flat surface abutting the one or more dielectric layers 124. The non-flat surface causes the field plate 122 to have a first thickness t$_1$ in a region over the gate electrode 108 and a second thickness t$_2$, larger than the first thickness t$_1$ in a region overlying the drift region 204.

A plurality of contacts 120 are also surrounded by the first ILD layer 118. The plurality of contacts 120 may comprise a first contact 120a coupled to the contact region 208, a second contact 120b coupled to the drain region 106, and a third contact 120c coupled to the gate electrode 108. In some embodiments, the first contact 120a may comprise a butted contact (not shown), which contacts both the contact region 208 and the source region 104. In some embodiments, the plurality of contacts 120 and the field plate 122 may comprise a same metal material. For example, the plurality of contacts 120 and the field plate 122 may comprise one or more of tungsten (W), tantalum-nitride (TaN), titanium (Ti), titanium-nitride (TiN), aluminum copper (AlCu), copper (Cu), and/or other similar conductive materials.

Figure 3:
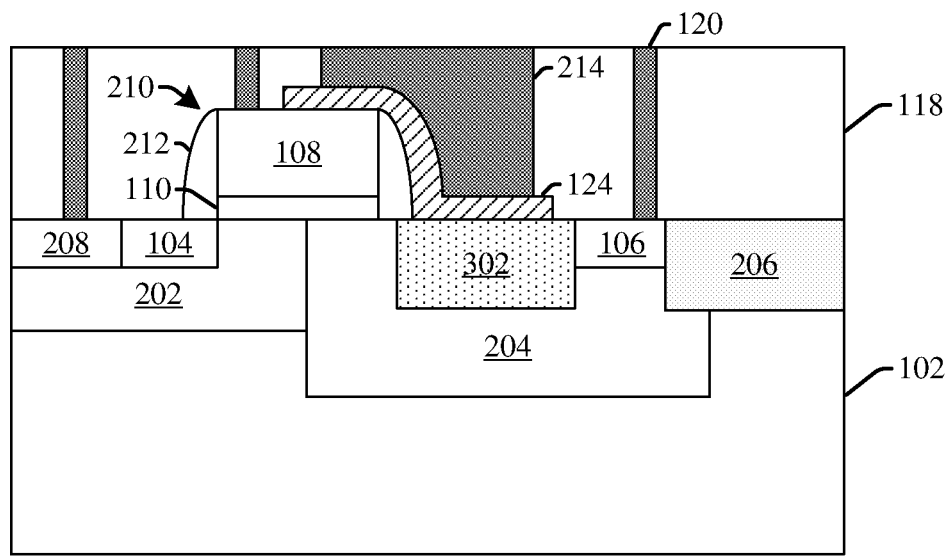

FIG. 3 illustrates a cross-sectional view of some additional embodiments of a disclosed high voltage LDMOS device 300 having a field plate 214.

LDMOS device 300 comprises an isolation region 302 disposed within the drift region 204 at a position that is laterally arranged between the gate structure 210 and the drain region 106. The isolation region 302 improves isolation between the gate structure 210 and the drain region 106, so as to prevent dielectric breakdown between the gate structure 210 and the drift region 204 when the LDMOS device 300 is operated at large operating voltages. For example, the isolation region 302 region may be introduced into the drift region 204 of an LDMOS device, which is designed to operate at a first breakdown voltage, to increase the breakdown voltage of the LDMOS device 300 without significantly changing the fabrication process the LDMOS device. In some embodiments, the isolation region 302 may comprise a shallow trench isolation (STI). In other embodiments, the isolation region 302 may comprise a field oxide.

Figure 4:
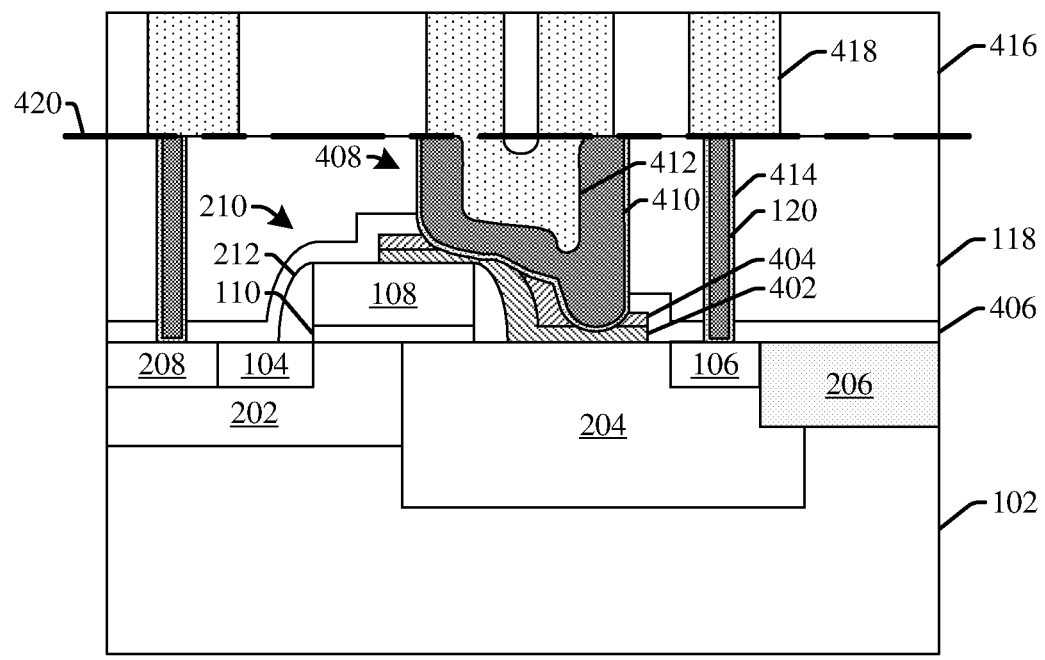

FIG. 4 illustrates a cross-sectional view of some additional embodiments of disclosed high voltage LDMOS device 400 having a field plate 408.

LDMOS device 400 comprises a plurality of dielectric layers 402-404 arranged between the field plate 408 and the gate structure 210 and/or the drift region 204. The plurality of dielectric layers 402-404 are configured to electrically isolate a field plate 408 from the gate structure 210 and/or the drift region 204. In embodiments, the plurality of dielectric layers 402-404 may comprise two or more different dielectric materials. In some embodiments, the plurality of dielectric layers 402-404 may comprise one or more dielectric layers that are used during a typical CMOS fabrication process, so as to limit additional fabrication steps used to electrically isolate the field plate 408 from the gate structure 210 and/or the drift region 204.

For example, the plurality of dielectric layers 402-404 may comprise a silicide blocking layer 402. In some embodiments, the silicide blocking layer 402 may comprise a resist-protection oxide (RPO) layer configured to prevent silicide formation. The silicide blocking layer 402 may be arranged over portions of the gate electrode 108 and the drift region 204. In some embodiments, the silicide blocking layer 402 may continuously extend from over the gate electrode 108 to over the drift region 204.

In some embodiments, the plurality of dielectric layers 402-404 may further comprise a field plate etch stop layer (ESL) 404. The field plate ESL 404 may be disposed over the silicide blocking layer 402 and is configured to control etching of an opening for the field plate 408. The field plate ESL 404 may account for differences in the etch depth between the contacts 120 and the field plate 408 and/or for differences in etching rate (e.g., due to the etch loading effect). In some embodiments, the field plate ESL 404 may comprise a silicon nitride (SiN) layer, for example.

In some alternative embodiments (not shown), the plurality of dielectric layers 402-404 may additionally or alternatively comprise a gate dielectric layer. In such embodiments, the gate dielectric layer may be arranged laterally adjacent to the gate structure 210 at a position that overlies the drift region 204. In some embodiments, the dielectric layer oxide may comprise silicon dioxide (e.g., SiO$_2$) or a high-k gate dielectric material. In yet other embodiments, the plurality of dielectric layers 402-404 may additionally or alternatively comprise an ILD layer (e.g., first ILD layer 118).

A contact etch stop layer (CESL) 406 is disposed over the semiconductor substrate 102 and the field plate ESL 404. In some embodiments, the CESL 406 extends over the semiconductor substrate 102 at positions between the plurality of contacts 120 and the field plate 408, so that the CESL 406 abuts sidewalls of the plurality of contacts 120 and the field plate 408. The CESL 406 overlies the gate structure 210. In some embodiments, the CESL 406 may also overlie the plurality of dielectric layers 402-404. In other embodiments, one or more of the plurality of dielectric layers 402-404 (e.g., the field plate ESL 404) may overlie the CESL 406. In some embodiments, the CESL 406 may comprise a nitride layer. For example, the CESL 406 may comprise silicon nitride (SiN).

A field plate 408 is disposed within first ILD layer 118 and abuts the CESL 406 and one or more of the plurality of dielectric layers 402-404. In some embodiments, the field plate 408 extends though the CESL 406 to abut one or more of the plurality of dielectric layers 402-404. In such embodiments, one or more of the plurality of dielectric layers 402-404 separate the field plate 408 from the gate structure 210 and the drift region 204.

In some embodiments, the field plate 408 may comprise a first metal material 410 and a second metal material 412. The first metal material 410 may comprise a glue layer that is disposed along outer edges of the field plate 408, while the second metal material 412 is embedded within the first metal material 410 in an inner region of the field plate 408 (i.e., the second metal material 412 is separated from the CESL 406 by way of the first metal material 410). In some embodiments, a liner layer 414 may be disposed between the first ILD layer 118 and the first metal material 410.

In some embodiments, the first metal material 410 disposed along outer edges of the field plate 408 has a top surface that is arranged along a substantially planar surface 420 (i.e., a planar surface formed by a planarization process). The planar surface 420 may be aligned with top surfaces of the plurality of contacts 120. In some embodiments, the first metal material 410 comprises a same material as the plurality of contacts 120 and the second metal material 412 comprises a same material as a first metal wire layer 418 overlying the plurality of contacts 120. For example, in some embodiments, the first metal material 410 may comprise tungsten (W), titanium (Ti), tantalum nitride (TaN) or titanium nitride (TiN). In some embodiments, the second metal material 412 may comprise copper (Cu) or aluminum copper (AlCu).

It will be appreciated that due to its integration with the BEOL (back-end-of-the-line) metallization layers, the disclosed field plate allows for various field plate bias configurations to be easily achieved for different design considerations. For example, the field plate biasing can be changed by changing a metal routing layer rather than by changing a design of a disclosed high voltage device. Furthermore, it will be appreciated that biasing the high voltage transistor device by way of BEOL metal interconnect routing allows for a variety of field plate bias configurations to be integrated on a same chip using a single fabrication process flow.

Figure 5:
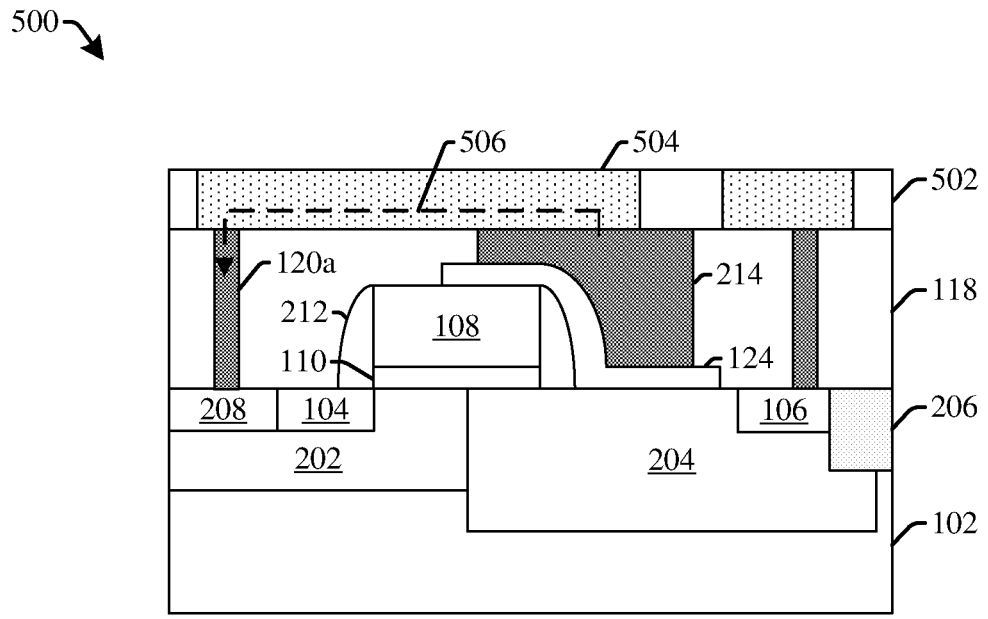
FIGS. 5-6 illustrate cross-sectional views of some embodiments of field plate biasing configurations for a high voltage LDMOS device achieved by metal interconnect routing.
Figure 6:
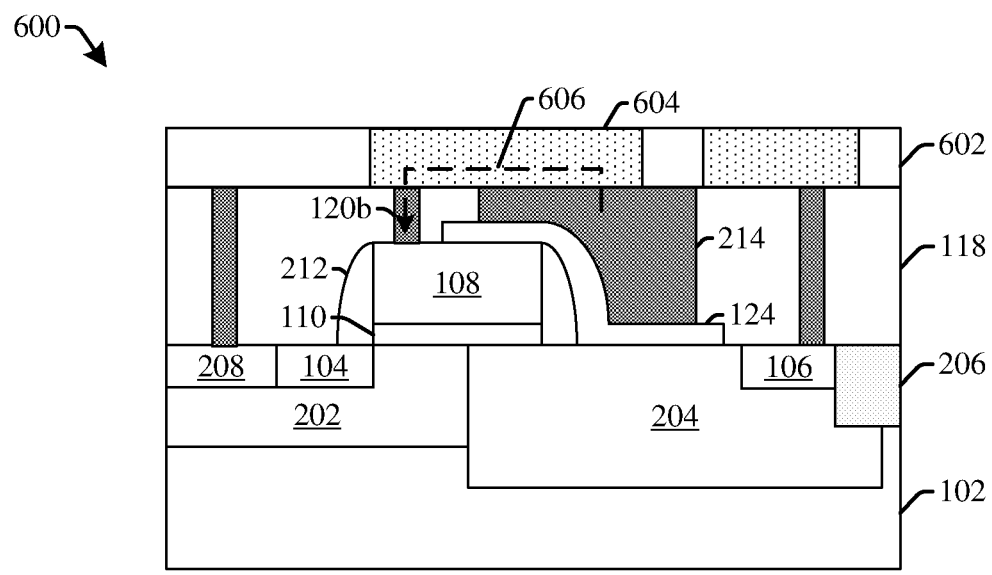

FIGS. 5-6 illustrate cross-sectional views of some embodiments of field plate biasing configurations for a high voltage transistor device achieved by BEOL metal interconnect routing. Although FIGS. 5-6 illustrate a connection between the field plate 214 and the contact region 208 or gate electrode 108 by way of a first metal wire layer (e.g., 504 or 604), the BEOL metal interconnect routing is not limited thereto. Rather, it will be appreciated that the field plate 214 can be connected to a source region, a gate electrode, a drain region, or a bulk contact by any combination of BEOL metal interconnect layers (e.g., a first metal wire layer, a first metal via layer, a second metal wire layer, etc.).

FIG. 5 illustrates a cross-sectional view of a high voltage LDMOS device 500 in which the field plate 214 is electrically coupled to the contact region 208 along conduction path 506. The field plate 214 is connected to a first metal wire layer 504 disposed within a second ILD layer 502. The first metal wire layer 504 is coupled to a contact 120a that abuts the contact region 208. By electrically coupling the field plate 214 to the contact region 208, the field plate 214 is biased by the source voltage. Biasing the field plate 214 by the source voltage provides high voltage LDMOS device 500 with a low on-state resistance Rds(on) and low dynamic power dissipation (e.g., low Rds(on)*Qgd vs. BV). The low dynamic power dissipation provides for good performance during high frequency switching applications.

FIG. 6 illustrates a cross-sectional view of a high voltage LDMOS device 600 in which the field plate 214 is electrically coupled to the gate electrode 108 along conduction path 606. The field plate 214 is connected to a first metal wire layer 604 disposed within a second ILD layer 602. The first metal wire layer 604 is connected to a contact 120b that abuts the gate electrode 108. By electrically coupling the field plate 214 to the gate electrode 108, the field plate 214 is biased by the gate voltage. Biasing the field plate 214 by the gate voltage provides high voltage LDMOS device 600 with a low Rds(on) vs. breakdown voltage.

The variety of field plate bias configurations allow for the disclosed field plate to form a versatile high voltage transistor device that can be used for different applications. For example, the on-state resistance Rds(on) of a high voltage transistor device having a gate bias field plate is lower than the Rds(on) of a high voltage transistor device having a source biased field plate. However, the Rds(on))*Qgd of a high voltage transistor device having a source bias field plate is lower than the Rds(on))*Qgd of a high voltage transistor device having a gate source biased field plate. Therefore, a high voltage transistor device having a gate bias field plate (e.g., high voltage LDMOS device 500) may be used in low frequency switching applications (e.g., below 10 MHz), while a high voltage transistor device having a source bias field plate (e.g., high voltage LDMOS device 600) may be used in high frequency switching applications (e.g., above 10 MHz).

Figure 7A:
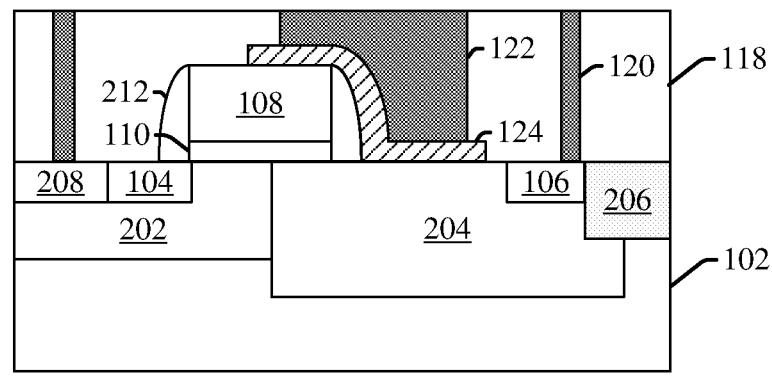
FIGS. 7A-7C illustrate cross-sectional views of some embodiments of high voltage LDMOS devices in different switching isolation configurations.
Figure 7B:
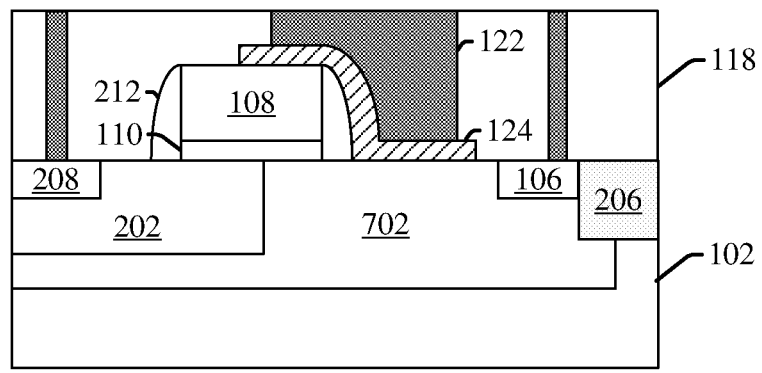
Figure 7C:
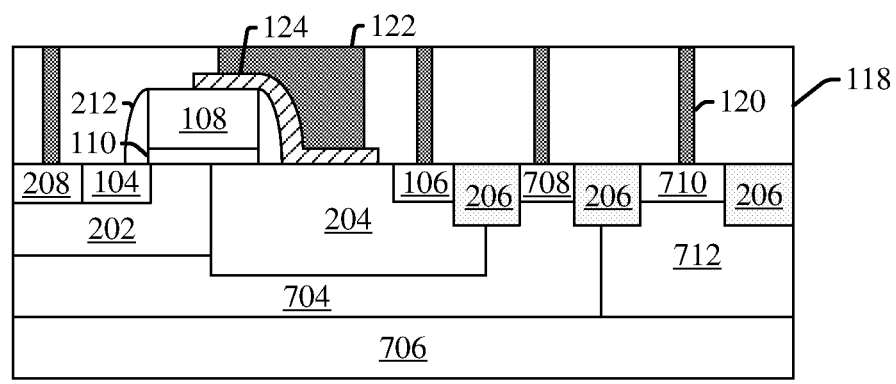

FIGS. 7A-7C illustrate cross-sectional views of some embodiments of high voltage LDMOS devices 700a-700c in different switching isolation configurations.

As shown in FIG. 7A, high voltage LDMOS device 700a is configured as a low-side switch (e.g., a switch connected to ground in an inverter). In such a configuration, the high voltage LDMOS device 700a has a source region 104 that is floating so that the voltage on the source region 104 can change during switching cycles.

As shown in FIG. 7B, high voltage LDMOS device 700b is configured as a high-side switch (e.g., a switch connected to $V_{DD}$ in an inverter). In such a configuration, the high voltage LDMOS device 700b has a source region 104 that is connected to a source voltage. The high voltage LDMOS device 700b has a drift region 702 that extends below the body region 202 to prevent the source voltage from being raised over the substrate voltage by preventing charge carriers from traveling from the contact region 208 to the semiconductor substrate 102 (e.g., by way of punch through).

As shown in FIG. 7C, high voltage LDMOS device 700c is fully isolated from the substrate to allow for independent biasing. The high voltage transistor device 700c comprises a deep well 704 and an oppositely doped underlying buried layer 706 configured to provide for vertical isolation. In some embodiments, the deep well 704 may have the first doping type (e.g., a same doping type as the body region 202) and the buried layer 706 may have the second doping type.

The high voltage LDMOS device 700c further comprises one or more additional STI regions 206 that laterally separate the drain region from a bulk region 708 and a buried layer 710 having the second doping type. The bulk region 708 overlies the deep well 704 and the buried layer 710 overlies a well region 712 having the second doping type and abutting the buried layer 706. Contacts 120 are configured to provide for biasing voltages to the bulk region 708 and the buried layer 710, so as to form junction isolation between the deep well 704 and the buried layer 706 and the well region 712. The junction isolation allows the fully isolated, high voltage LDMOS device 700c to operate over a range of bias voltages.

Figure 8:
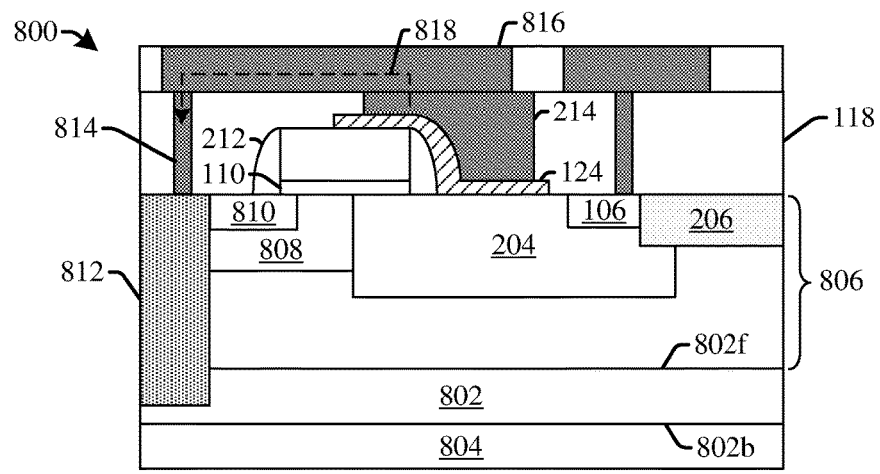
FIG. 8 illustrates a cross-sectional view of a source downward high voltage transistor device having a field plate.

FIG. 8 illustrates a cross-sectional view of a source downward high voltage transistor device 800 having a field plate 214.

The high voltage transistor device 800 comprises substrate 802 having a first doping type (e.g., a p+ doping type) with a high doping concentration. A source region 804 disposed along a backside 802b of a substrate 802. In various embodiments, the source region 804 may comprise a highly doped region or a metal layer. An epitaxial layer 806 having the first conductivity type is disposed over a front side surface 802f of the substrate 802. The dopant concentration of the epitaxial layer 806 is less than the dopant concentration of the substrate 802. A source contact region 810, a drain region 106, a body region 808, and a drift region 204 are disposed within a top surface of the epitaxial layer 806.

A conductive material 812 extends from the top surface of the epitaxial layer 806 to the substrate 802. The conductive material 812 may comprise a highly doped deep well region. The conductive material 812 allows for a source connection to be made from the backside of the substrate 802, thereby reducing metal routing complexity and enabling various packaging compatibility. In some embodiments, the field plate 214 may be biased by the source voltage, by way of an electrical path 818 extending through a contact 814 abutting the conductive material 812 and an overlying metal wire layer 816 coupled to the field plate 214.

Figures 9A, 9B:
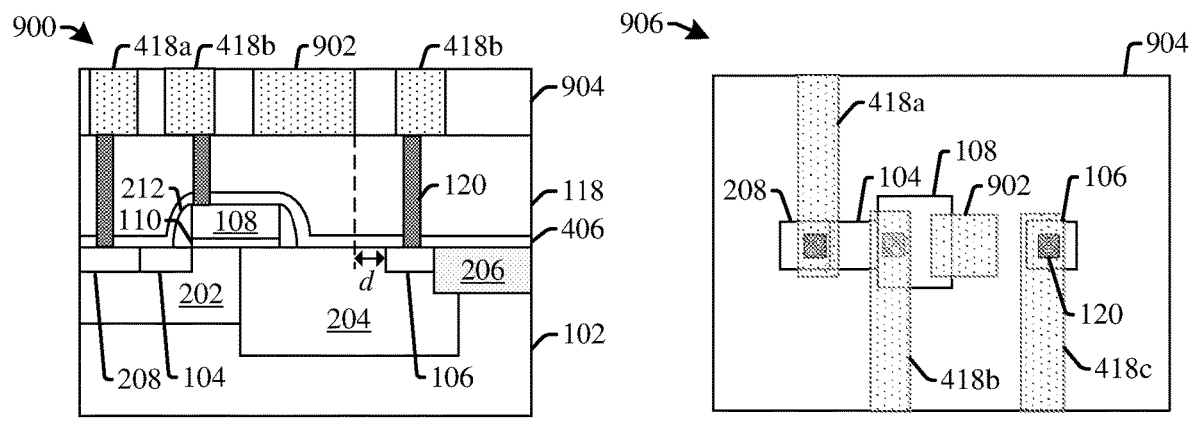
FIGS. 9A-9B illustrate some embodiments of a disclosed high voltage LDMOS having a field plate on a metal wire layer.

FIGS. 9A-9B illustrate some embodiments of a disclosed high voltage LDMOS device having a field plate 902 in a metal wire layer. Although FIGS. 9A-9B illustrate the field plate as being on a first metal wire layer, it will be appreciated that the disclosed field plate is not limited to a first metal wire layer, but rather may be implemented on alternative layers of a BEOL metallization stack.

As shown in cross-sectional view 900, of FIG. 9A, the field plate 902 is disposed in a first metal wire layer within a second ILD layer 904 overlying a first ILD layer 118. In some embodiments, the field plate 902 has substantially planar top and bottom surfaces so as to give the field plate 902 a planar topology. The field plate 902 is vertically separated from the gate structure 210 and the drift region 204 by way of the first ILD layer 118. The field plate 902 overlies portions of the gate electrode 108 and the drift region 204 and is laterally separated from the source region 104 and the drain region 106. For example, the field plate 902 may be laterally separated from the drain region 106 by a distance d. In some embodiments, the field plate 902 may laterally extend from over the gate electrode 108 to over the drift region 204.

As shown in top view 906, of FIG. 9B, the field plate 902 comprises a metal structure overlying portions of the gate electrode 108 and the drift region 204. The metal structure is not connected to an underlying element by way of a contact 120 or to another metal structure on the first metal wire layer. Rather, the metal structure will be connected to an overlying via (not shown) configured to connect the field plate to an overlying metal wire layer that enables the field plate 902 to be biased.

Figure 10:
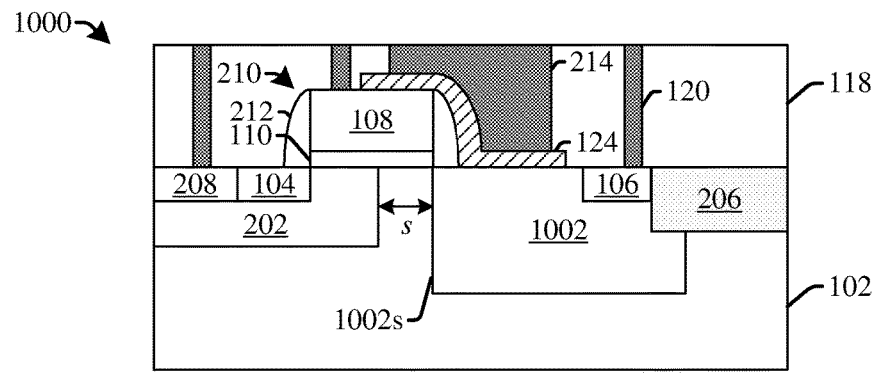
FIG. 10 illustrates some embodiments of a high voltage LDMOS device having a self-aligned drift region.

FIG. 10 illustrates some embodiments of a disclosed high voltage LDMOS device 1000 having a self-aligned drift region 1002.

The self-aligned drift region 1002 has a sidewall 1002s that is substantially aligned with a sidewall of the gate electrode 108 and the gate dielectric layer 110. In some alternative embodiments, the self-aligned drift region 1002 may be formed to have a sidewall 1002s that is substantially aligned with an edge of a sidewall spacer 212. By aligning the self-aligned drift region 1002 with a sidewall of the gate electrode 108 and the gate dielectric layer 110, the self-aligned drift region 1002 is laterally separated from the body region 202 by a spacing s, thereby minimizing gate-to-drain overlap and achieving low gate-drain charge (Qgd) and good high frequency performance. The field plate 214 overlying the self-aligned drift region 1002 can further reduce the gate-drain charge (Qgd).

Figure 11:
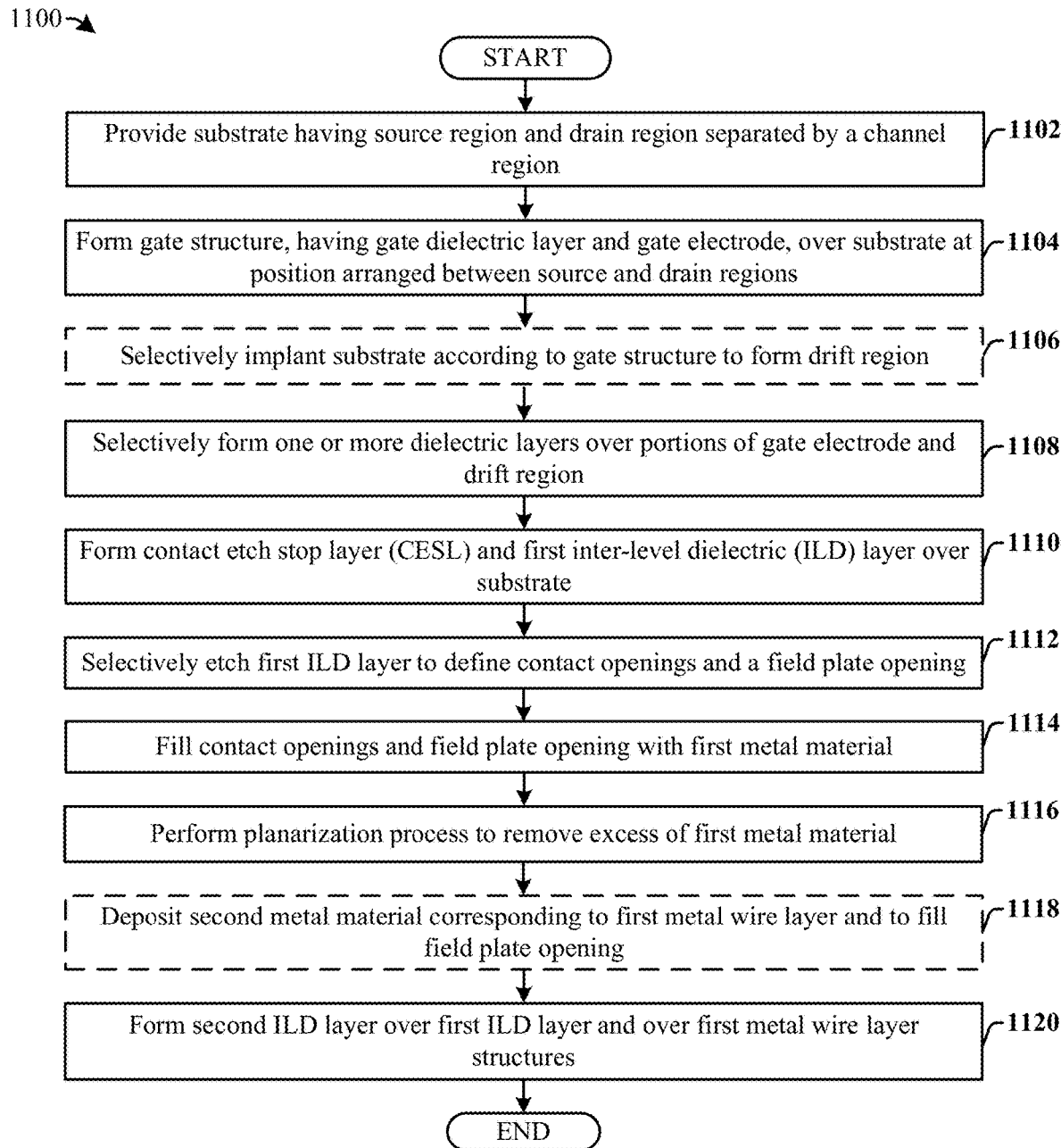
FIG. 11 illustrates a flow diagram of some embodiments of a method of forming a high voltage transistor device having a field plate.

FIG. 11 illustrates a flow diagram of some embodiments of a method 1100 of forming a high voltage transistor device having a field plate. The method may form the field plate using process steps that are already used during a standard CMOS fabrication process, and therefore can provide for a low cost, versatile field plate.

While the disclosed methods (e.g., methods 1100 and 3300) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1102, a substrate is provided having a source region and a drain region separated by a channel region. In some embodiments, the substrate may further comprise a drift region located between the source region and the drain region at a position adjacent to the channel region.

At 1104, a gate structure is formed over the substrate at a position arranged between the source region and the drain region. The gate structure may comprise a gate dielectric layer and an overlying gate electrode.

At 1106, the drift region may be formed using a self aligned process, which selectively implants the semiconductor substrate according to the gate structure to form a drift region, in some embodiments.

At 1108, one or more dielectric layers are selectively formed over a portion of the gate electrode and the drift region.

At 1110, a contact etch stop layer (CESL) and a first inter-level dielectric (ILD) layer are formed over the substrate.

At 1112, the first ILD layer is selectively etched to define contacts openings and a field plate opening.

At 1114, the contact openings and the field plate opening is filled with a first metal material.

At 1116, a planarization process may be performed to remove excess of the first metal material overlying the first ILD layer.

At 1118, a second metal material corresponding to a first metal wire layer is deposited. In some embodiments, the second metal material may further fill the field plate opening. In such embodiments, the second metal material is embedded within the first metal material within the field plate opening.

At 1120, a second inter-level dielectric (ILD) layer is formed over the first ILD layer and over first metal wire layer structures.

FIGS. 12-19 illustrate cross-sectional views of some embodiments showing a method of forming a MOSFET device having a field plate. Although FIGS. 12-19 are described in relation to method 1100, it will be appreciated that the structures disclosed in FIGS. 12-19 are not limited to such a method, but instead may stand alone as structures independent of the method.

Figure 12:
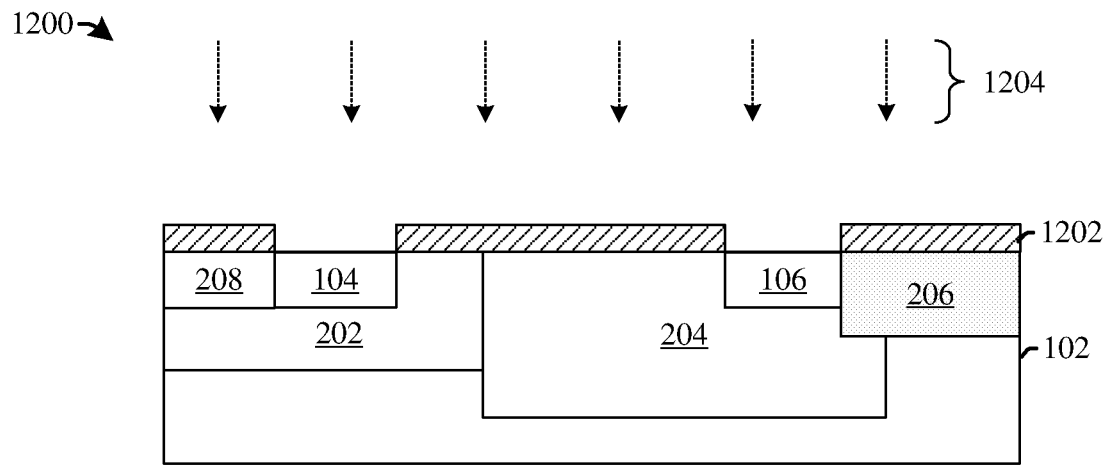
FIGS. 12-19 illustrate cross-sectional views of some embodiments showing a method of forming a high voltage transistor device having a field plate.

FIG. 12 illustrates some embodiments of a cross-sectional view 1200 corresponding to act 1102.

As shown in cross-sectional view 1200, a semiconductor substrate 102 is provided. The semiconductor substrate 102 may be intrinsically doped with a first doping type. In various embodiments, the semiconductor substrate 102 may comprise any type of semiconductor body (e.g., silicon, SOI), which includes, but is not limited to a semiconductor die or wafer or one or more die on a wafer, as well as any other type of semiconductor and/or epitaxial layers formed thereon and/or otherwise associated therewith.

The semiconductor substrate 102 may be selectively implanted using various implantation steps to form a plurality of implantation regions (e.g., well regions, contact regions, etc.). For example, the semiconductor substrate 102 may be selectively implanted to form a body region 202, a drift region 204, a source region 104, a drain region 106, and a contact region 208. The plurality of implantation regions may be formed by selectively masking the semiconductor substrate 102 (e.g., using a photoresist mask) and then introducing high-energy dopants 1204 (e.g., p-type dopant species such as boron or n-type dopants such as phosphorous) into exposed areas of the semiconductor substrate 102. For example, as shown in cross-sectional view 1200, a masking layer 1202 is selectively patterned to expose portions of the semiconductor substrate 102, into which high-energy dopants 1204 are subsequently implanted to form source region 104 and drain region 106.

It will be appreciated that the implantation regions shown in cross-sectional view 1200 are one example of possible implantation regions and that the semiconductor substrate 102 may comprise other configurations of implantation regions, such as any of those illustrated in FIGS. 1-10, for example.

Figure 13:
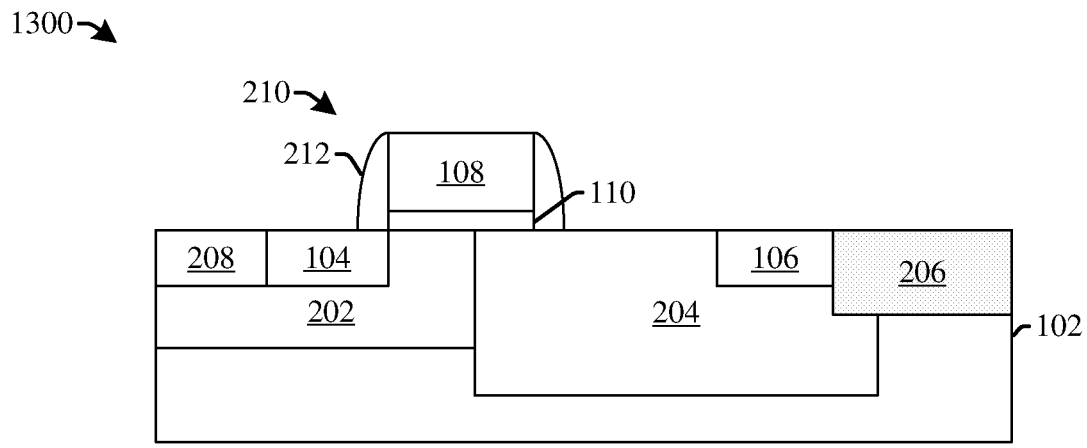

FIG. 13 illustrates some embodiments of a cross-sectional view 1300 corresponding to act 1104.

As shown in cross-sectional view 1300, a gate structure 210 is formed over a semiconductor substrate 102 at a position arranged between the source region 104 and the drain region 106. The gate structure 210 may be formed by forming a gate dielectric layer 110 over the semiconductor substrate 102, and by forming a gate electrode material 108 over the gate dielectric layer 110. In some embodiments, the gate dielectric layer 110 and the gate electrode material 108 may be deposited by a vapor deposition technique. The gate dielectric layer 110 and the gate electrode material 108 may be subsequently patterned and etched (e.g., according to a photoresist mask) to define the gate structure 210. In some embodiments, the sidewall spacers 212 may be formed on opposing sides of the gate electrode 108 by depositing a nitride or oxide based material onto the semiconductor substrate 102, and selectively etching the nitride or oxide based material to form the sidewall spacers 212.

Figure 14:
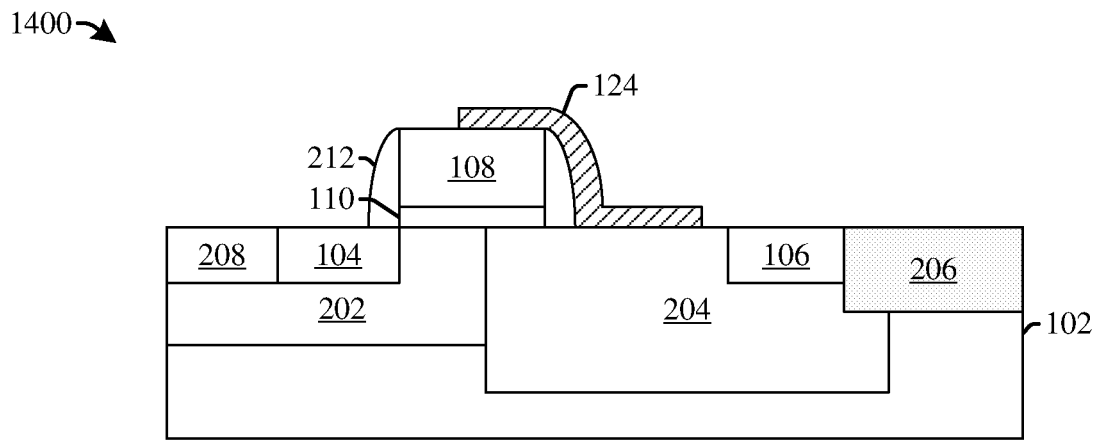

FIG. 14 illustrates some embodiments of a cross-sectional view 1400 corresponding to act 1108.

As shown in cross-sectional view 1400, one or more dielectric layers 124 are selectively formed over the gate electrode 108 and the drift region 204. In some embodiments, the one or more dielectric layers 124 may be deposited by a vapor deposition technique, and subsequently patterned and etched (e.g., according to a photoresist mask). In some embodiments, the one or more dielectric layers 124 may be etched to expose a portion of the gate electrode 108 and to be laterally spaced apart from the drain region 106.

In some embodiments, the one or more dielectric layers 124 may comprise a silicide blocking layer, such as a resist-protection oxide (RPO) layer. In other embodiments, the one or more dielectric layers 124 may further and/or alternatively comprise a field plate etch stop layer (ESL). In some embodiments, the field plate ESL may be a silicon nitride (SiN) layer formed by a vapor deposition technique. In yet other embodiments, the one or more dielectric layers 124 may further and/or alternatively comprise a gate dielectric layer or an inter-level dielectric (ILD) layer.

Figure 15:
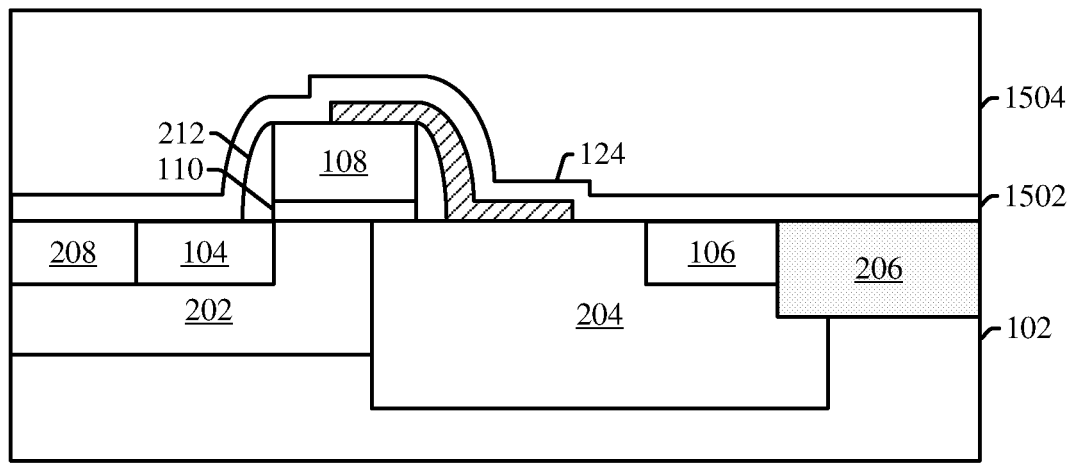

FIG. 15 illustrates some embodiments of a cross-sectional view 1500 corresponding to act 1110.

As shown in cross-sectional view 1500, a contact etch stop layer (CESL) 1502 is formed over the semiconductor substrate 102. In some embodiments, the CESL 1502 may be formed by a vapor deposition process. A first inter-level dielectric (ILD) layer 1504 is then formed over the CESL 1502. In some embodiments, the first ILD layer 1504 may comprise an ultra-low k dielectric material or a low-k dielectric material (e.g., SiCO). In some embodiments, the first ILD layer 1504 may also be formed by a vapor deposition process. In other embodiments, the first ILD layer 1504 may be formed by a spin coating process. It will be appreciated that the term inter-level dielectric (ILD) layer as used herein may also refer to inter-metal dielectric (IMD) layers.

Figure 16:
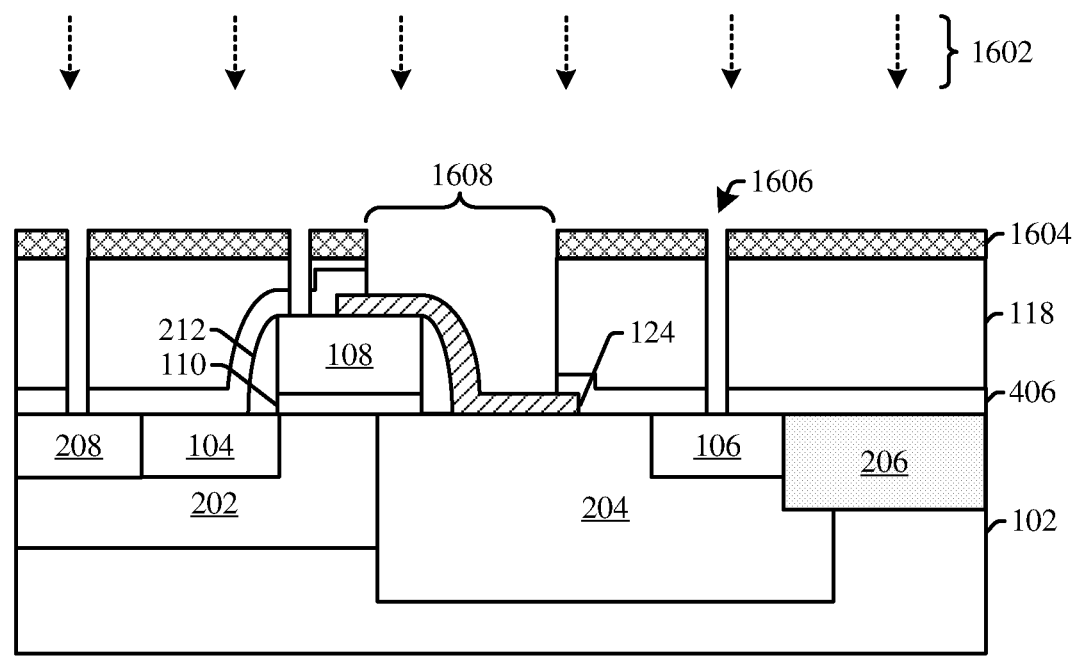

FIG. 16 illustrates some embodiments of a cross-sectional view 1600 corresponding to act 1112.

As shown in cross-sectional view 1600, the first ILD layer 1504 is selectively exposed to a first etchant 1602 configured to form contacts openings 1606 and a field plate opening 1608. In some embodiments, the contact openings 1606 may be smaller than the field plate opening 1608. In some embodiments, the first ILD layer 1504 is selectively exposed to the first etchant 1602 according to a masking layer 1604 (e.g., a photoresist layer or a hard mask layer). In some embodiments, the first etchant 1602 may have a large etching selectivity between the first ILD layer 1504 and a field plate ESL within the one or more dielectric layers 124. In some embodiments, the first etchant 1602 may comprise a dry etchant. In some embodiments, the dry etchant may have an etching chemistry comprising one or more of oxygen (O2), nitrogen (N2), hydrogen (H2), argon (Ar), and/or a fluorine species (e.g., $CF_4$, $CHF_3$, $C_4F_8$, etc.). In other embodiments, the first etchant 1602 may comprise a wet etchant comprising a buffered hydroflouric acid (BHF).

Figure 17:
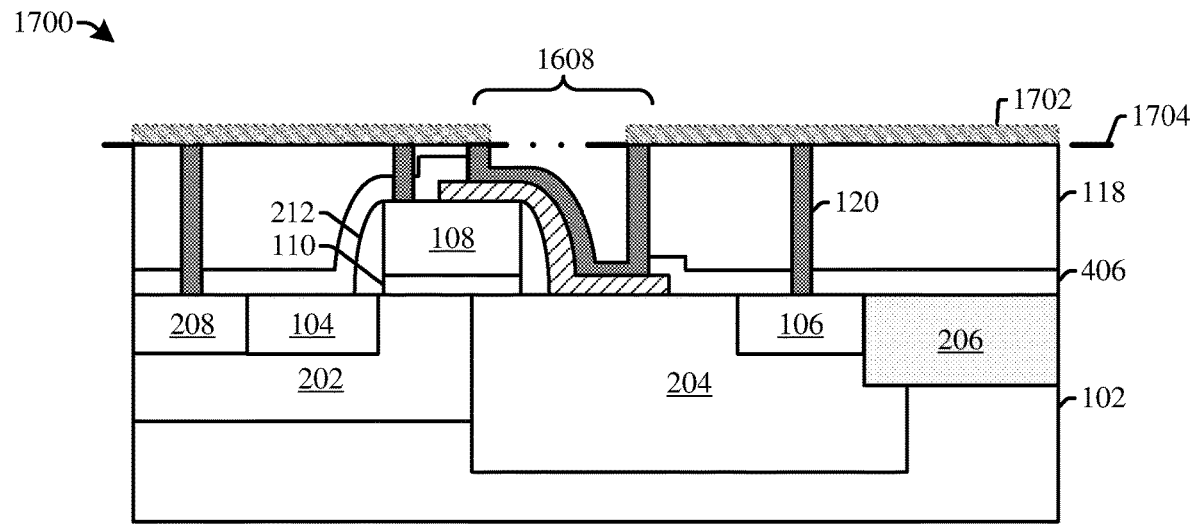

FIG. 17 illustrates some embodiments of a cross-sectional view 1700 corresponding to acts 1114-1116.

As shown in cross-sectional view 1700, the contact openings 1606 and the field plate opening 1608 are filled with a first metal material 1702. In some embodiments, the first metal material 1702 may be deposited by way of a vapor deposition technique (e.g., CVD, PVD, PE-CVD, etc.). In some embodiments, the first metal material 1702 may be formed by depositing a seed layer by way of physical vapor deposition, followed by a plating process (e.g., an electroplating or electro-less plating process). A planarization process (e.g., chemical mechanical planarization) may be subsequently performed to remove excess of the first metal material 1702 and to form a planar surface along line 1704.

In some embodiments, the first metal material 1702 may comprise tungsten (W), titanium (Ti), titanium nitride (TiN), or tantalum nitride (TaN). In some embodiments, a diffusion barrier layer and/or a liner layer may be deposited into the contact openings 1606 and the field plate opening 1608 prior to depositing the first metal material 1702.

Figure 18:
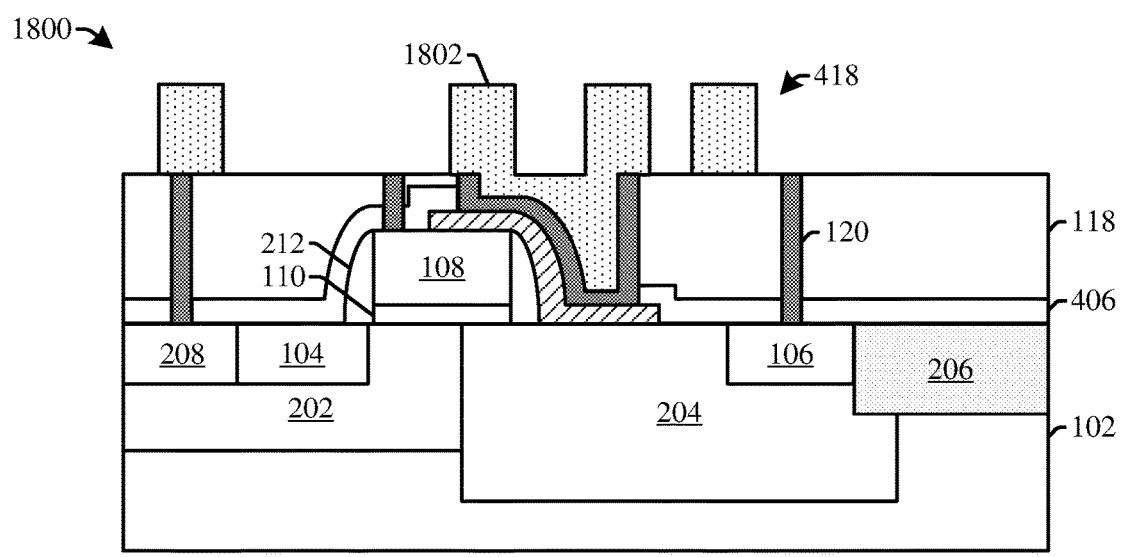

FIG. 18 illustrates some embodiments of a cross-sectional view 1800 corresponding to act 1118.

As shown in cross-sectional view 1800, a second metal material 1802 is deposited. The second metal material 1802 is formed within remaining openings in the field plate opening and over the first ILD layer 118. In some embodiments, the second metal material 1802 may be deposited by way of a vapor deposition technique (e.g., CVD, PVD, PE-CVD, etc.). In some embodiments, the second metal material 1802 may be formed by depositing a seed layer by way of physical vapor deposition, followed by a plating process. In some embodiments, the second metal material 1802 may comprise copper (Cu) or an aluminum copper (AlCu) alloy.

After formation, the second metal material 1802 may be selectively patterned to define one or more metal structures of a first metal wire layer 418 overlying the first ILD layer 118. In some embodiments, the second metal material 1802 may be selectively patterned by forming a patterned masking layer (e.g., a photoresist layer or a hard mask layer)(not shown) over the second metal material 1802 and by subsequently etching the second metal material 1802 in areas exposed by the patterned masking layer.

Figure 19:
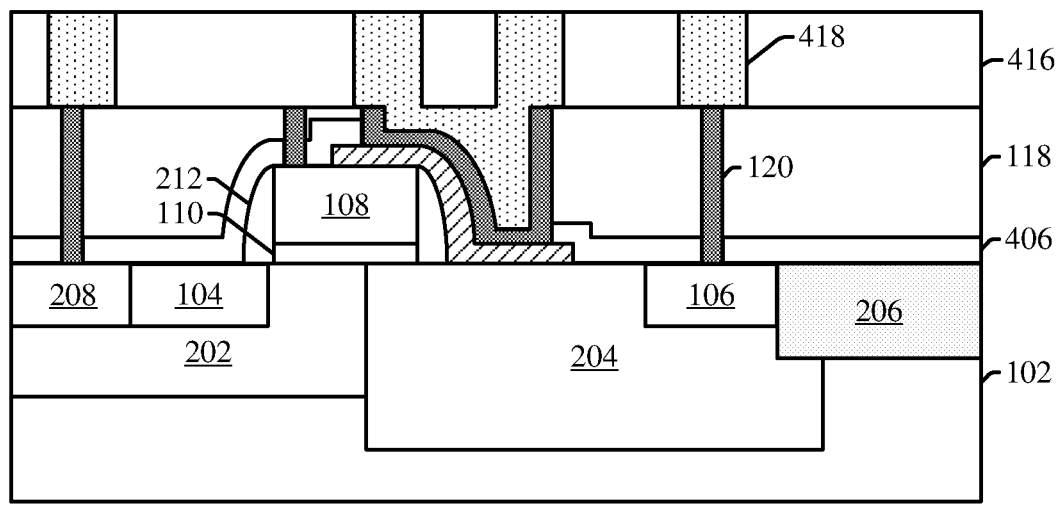

FIG. 19 illustrates some embodiments of a cross-sectional view 1900 corresponding to act 1120.

As shown in cross-sectional view 1900, a second ILD layer 416 is formed over the first ILD layer 118 and the one or more metal structures of a first metal wire layer 418. In various embodiments, the second ILD layer 416 may be formed by depositing a second ILD material over the first ILD layer 118 and the one or more metal structures of the first metal wire layer 418. After the second ILD layer 416 is formed, a planarization process (e.g., CMP) is performed to remove excess of the second ILD layer 416 and to expose top surfaces of the one or more metal structures of the first metal wire layer 418. In various embodiments, the second ILD layer 416 may comprise an ultra-low k dielectric material or a low-k dielectric material (e.g., SiCO) formed by a vapor deposition process or a spin coating process.

It has been appreciated that differences in heights of the plurality of contacts (e.g., 120) and the field plate (e.g., 122) may cause difficulties during fabrication of a disclosed transistor device. For example, because the field plate (e.g., 122) is formed over a dielectric layer 124 (e.g., a resist protective oxide), the field plate (e.g., 122) has a smaller height than the plurality of contacts (e.g., 120). However, the field plate (e.g., 122) and the plurality of contacts (e.g., 120) are formed using a same etching process. The differences in heights can lead to either an over-etching of a field plate opening (e.g., 1608 of FIG. 16) that results in shorting between the field plate (e.g., 122) and a conductive channel of a transistor device, or to an under-etching of contact openings (e.g., 1606 of FIG. 16) that results in poor connections between the plurality of contacts (e.g., 120) and the source region (e.g., 104), the drain region (e.g., 106), and/or the gate region (e.g., 116).

To prevent over-etching of a field plate opening or under-etching of contact openings, a composite etch stop layer may be used to control an etching depth of a field plate opening, in some embodiments. By controlling an etching depth of a field plate opening, the composite etch stop layer allows for both of the plurality of contacts (e.g., 120) and the field plate (e.g., 122) to be accurately formed to different heights.

Figure 20:
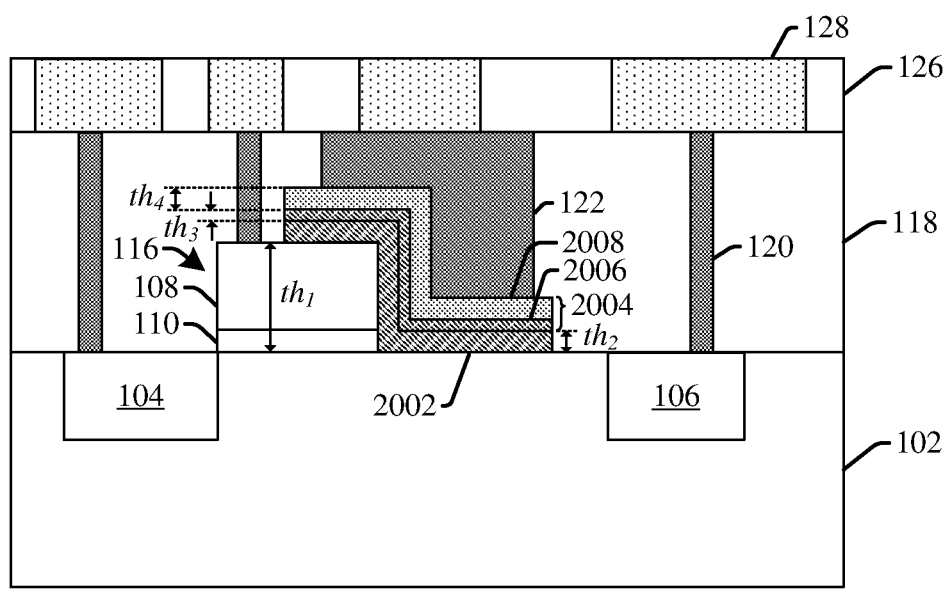
FIGS. 20-24 illustrate some embodiments of disclosed high voltage transistor devices having a composite etch stop layer that defines a field plate.

FIG. 20 illustrate a cross-sectional view of some embodiments of disclosed high voltage transistor device 2000 having a composite etch stop layer that defines a field plate.

The high voltage transistor device 2000 comprises a gate structure 116 disposed over a semiconductor substrate 102. The gate structure 116 comprises a gate dielectric layer 110 and an overlying gate electrode 108. In some embodiments, the gate structure 116 may have a first thickness $th_1$ in a range of between approximately 1000 Angstroms and approximately 2000 Angstroms. A source region 104 and a drain region 106 are disposed within the semiconductor substrate 102 on opposing sides of the gate structure 116.

A resist protective oxide (RPO) 2002 is arranged over the gate structure 116. The RPO 2002 extends from directly over the gate structure 116 to laterally past an outermost sidewall of the gate structure 116. In some embodiments, the RPO 2002 may vertically extend from an upper surface of the gate structure 116 to an upper surface of the semiconductor substrate 102, and laterally extend from directly over the gate structure 116 to between the gate structure 116 and the drain region 106. In some embodiments, the RPO 2002 may comprise silicon dioxide, silicon nitride, or the like. In some embodiments, the RPO 2002 may have a second thickness $th_2$ in a range of between approximately 100 Angstroms and approximately 1000 Angstroms.

A composite etch stop layer 2004 is arranged over the RPO 2002. In some embodiments, the composite etch stop layer 2004 directly contacts one or more upper surfaces of the RPO 2002. A first inter-level dielectric (ILD) layer 118 and a field plate 122 are arranged over the composite etch stop layer 2004. The first ILD layer 118 surrounds the field plate 122 and a plurality of contacts 120, which are coupled to the source region 104, the drain region 106, and the gate structure 116. In some embodiments, the field plate 122 and the plurality of contacts 120 may comprise a diffusion barrier (not shown) surrounding a conductive core including one or more metals.

The composite etch stop layer 2004 comprises a plurality of different dielectric materials 2006-2008 stacked over the RPO 2002. In some embodiments, the plurality of different dielectric materials 2006-2008 may have outermost sidewalls that are substantially aligned along lines perpendicular to an upper surface of the semiconductor substrate 102. In some embodiments, the plurality of different dielectric materials 2006-2008 may have outermost sidewalls that are substantially aligned with outermost sidewalls of the RPO 2002. In such embodiments, the RPO 2002 has a first width that is substantially equal to a second width of the composite etch stop layer 2004. The plurality of different dielectric materials 2006-2008 have different etching properties, which provide respective ones of the plurality of different dielectric materials 2006-2008 with a different etching selectivity to an etchant. The different etching selectivities allow the composite etch stop layer 2004 to slow etching of a field plate opening (i.e., an opening that defines the field plate 122) and therefore both closely control a height of the field plate and enable differences in heights between the plurality of contacts 120 and the field plate 122 (e.g., to enable the plurality of contacts 120 to have larger heights than the field plate 122).

For example, in some embodiments, a bottom of the field plate 122 contacts the composite etch stop layer 2004 along an interface that is vertically above a bottom surface of one or more of the plurality of contacts 120 (e.g., the contacts that are coupled to the source region 104 and the drain region 106). In such embodiments, during fabrication of the high voltage transistor device 2000, the composite etch stop layer 2004 reduces the etching rate of an etchant used to form a field plate opening (i.e., an opening that defines the field plate 122). The reduction in the etching rate causes the field plate 122 to have a bottom surface that is above bottom surfaces of one or more of the plurality of contacts 120.

In some embodiments, the composite etch stop layer 2004 may comprise a first dielectric material 2006 directly contacting an upper surface of the RPO 2002 and a second dielectric material 2008 directly contacting an upper surface of the first dielectric material 2006. In some embodiments, the first dielectric material 2006 may have a third thickness $th_3$ and the second dielectric material 2008 may have a fourth thickness $th_4$. In some embodiments, the RPO 2002 and the composite etch stop layer 2004 may respectively have a substantially constant thickness between outermost sidewalls. If the third thickness $th_3$ and the fourth thickness $th_4$ are too small (e.g., less than the minimum values set forth below), the composite etch stop layer 2004 is unable to effectively stop an etch that forms a field plate opening. If the third thickness $th_3$ and the fourth thickness $th_4$ are too large (e.g., larger than the maximum values set forth below), an effect of the field plate 122 on the high voltage transistor device 2000 is reduced, thereby negatively impacting device performance.

In some embodiments, the first dielectric material 2006 may comprise or be silicon nitride ($Si_xN_y$) and the second dielectric material 2008 may comprise or be silicon dioxide ($SiO_2$). In such embodiments, the first thickness $th_1$ may be in a first range of between approximately 50 Angstroms and approximately 400 Angstrom, and the second thickness $th_2$ may be in a second range of between approximately 150 Angstroms and approximately 700 Angstrom. In other embodiments, the first dielectric material 2006 may comprise or be silicon dioxide ($SiO_2$) and the second dielectric material 2008 may comprise or be silicon nitride ($SiN_x$) or silicon oxy-nitride ($SiO_xN_y$). In such embodiments, the first thickness $th_1$ may be in a first range of between approximately 600 Angstroms and approximately 900 Angstrom. In some embodiments, the second thickness $th_2$ may be in a second range of between approximately 100 Angstroms and approximately 500 Angstrom.

Figure 21A:
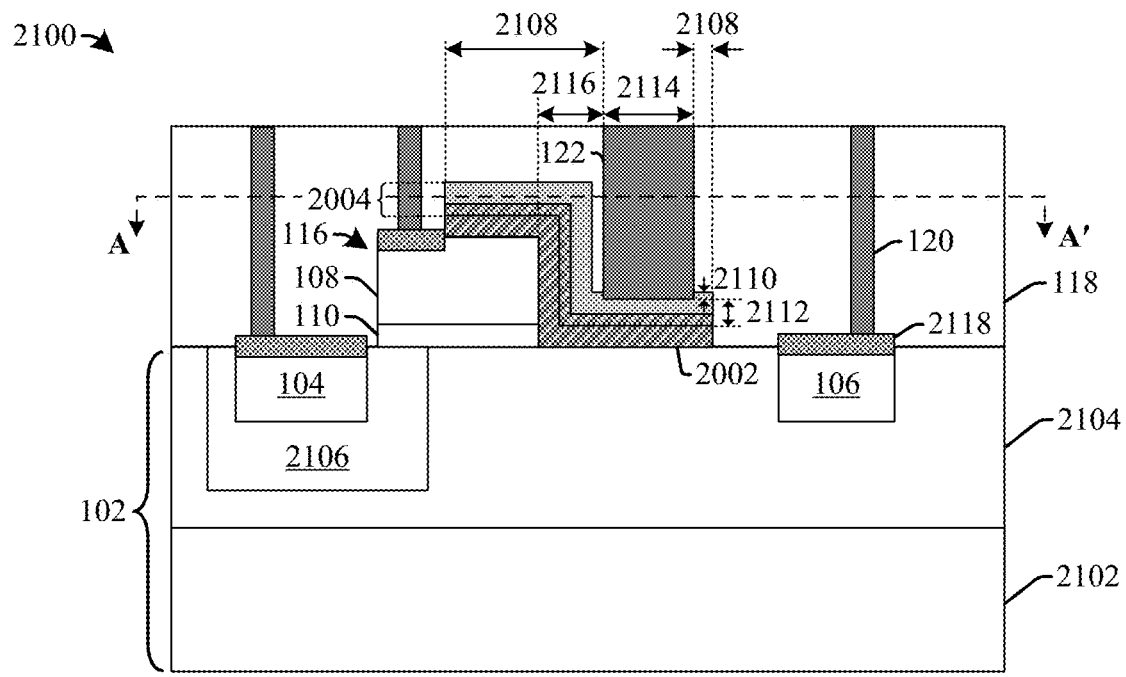
Figure 21B:
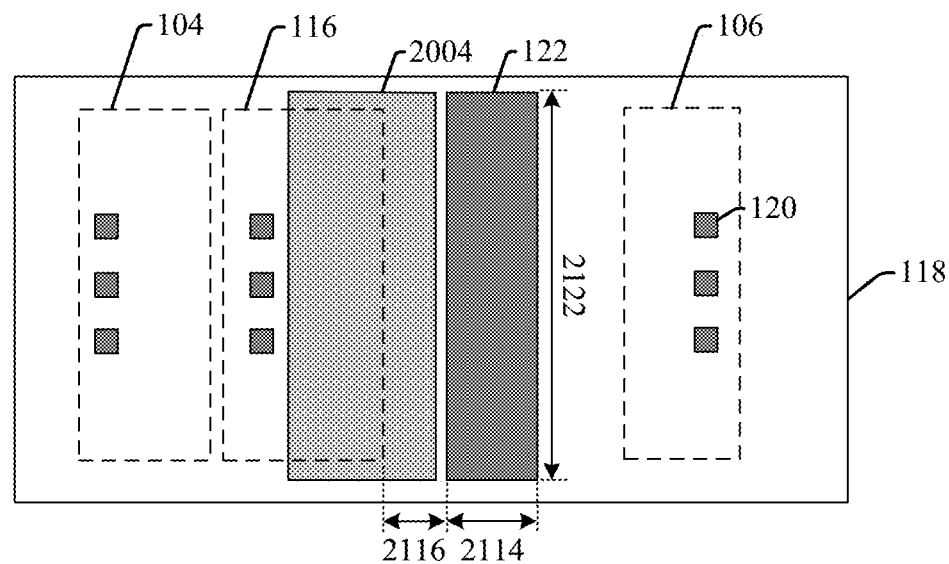

FIGS. 21A-21B illustrate some additional embodiments of a disclosed high voltage transistor device having a composite etch stop layer that defines a field plate.

As shown in cross-sectional view 2100 of FIG. 21A, the high voltage transistor device comprises a semiconductor substrate 102 having a body region 2106 disposed within a drift region 2104 over a substrate 2102. A source region 104 is arranged within the body region 2106 and a drain region 106 is arranged within the drift region 2104. In some embodiments, the source region 104, the drain region 106, and the drift region 2104 may have a first doping type (e.g., n-type), while the body region 2106 and the substrate 2102 have a second doping type (e.g., p-type) opposite the first doping type. In some embodiments, the source region 104 and the drain region 106 may comprise highly doped regions (i.e., n+ regions) having doping concentrations greater than the drift region 2104.

A gate structure 116 is arranged over the semiconductor substrate 102 between the source region 104 and the drain region 106. An RPO 2002 is arranged over the gate structure 116 and laterally extends past an outermost sidewall of the gate structure 116. A composite etch stop layer 2004 is arranged between the RPO 2002 and a field plate 122. In some embodiments, the RPO 2002 may enclose the field plate 122 (i.e., extend past an outermost sidewall of the field plate 122) for one or more lateral distances 2108 that are in a range of between approximately 0 microns and approximately 2 microns.

In some embodiments, the field plate 122 may extend to a non-zero depth 2110 into the composite etch stop layer 2004. In such embodiments, the field plate 122 contacts sidewalls of the composite etch stop layer 2004. In various embodiments, the field plate 122 may also contact a horizontally extending surface of the composite etch stop layer 2004 or a horizontally extending surface of the RPO 2002. In some embodiments, the non-zero depth 2110 may be in a range of between approximately 400 Angstroms and approximately 700 Angstroms. Because the field plate 122 extends into the composite etch stop layer 2004, the composite etch stop layer 2004 has a first thickness 2112 directly below the field plate 122 and a second thickness outside of the field plate 122 that is larger than the first thickness 2112. In some embodiments, the first thickness 2112 in a range of between approximately 0 Angstroms and approximately 10000 Angstroms. In some additional embodiments, the first thickness 2112 in a range of between approximately 600 Angstroms and approximately 300 Angstroms.

As shown in top-view 2120 of FIG. 21B (along cross-sectional line A-A' of FIG. 21A), the field plate 122 has a width 2114 that extends in a first direction for a distance having a range of between approximately 150 nanometers and approximately 2000 nanometers. The field plate 122 also has a length 2122 that extends in a second direction (perpendicular to the first direction) for a distance that is less than approximately 1000 um.

Referring again to cross-sectional view 2100 of FIG. 21A, in some embodiments, the field plate 122 may be laterally separated from the gate structure 116 by a distance 2116. For example, the field plate 122 may be laterally separated from the gate structure 116 by a distance 2116 in a range of between approximately 0 nm and approximately 500 nm. In other embodiments (not shown), the field plate 122 may laterally overlap (i.e., extend to directly over) the gate structure 116. For example, the field plate 122 may laterally overlap the gate structure 116 for a distance in a range of between approximately 0 nm and approximately 200 nm.

In some embodiments, a silicide layer 2118 is arranged over the source region 104, the drain region 106, and parts of the gate structure 116 that are not covered by the RPO 2002. In various embodiments, the silicide layer 2118 may comprise a compound having silicon and a metal such as nickel, platinum, titanium, tungsten, magnesium, or the like. In some embodiments, the silicide layer 2118 has a thickness in a range of between approximately 150 Angstroms and approximately 400 Angstroms.

Figure 22:
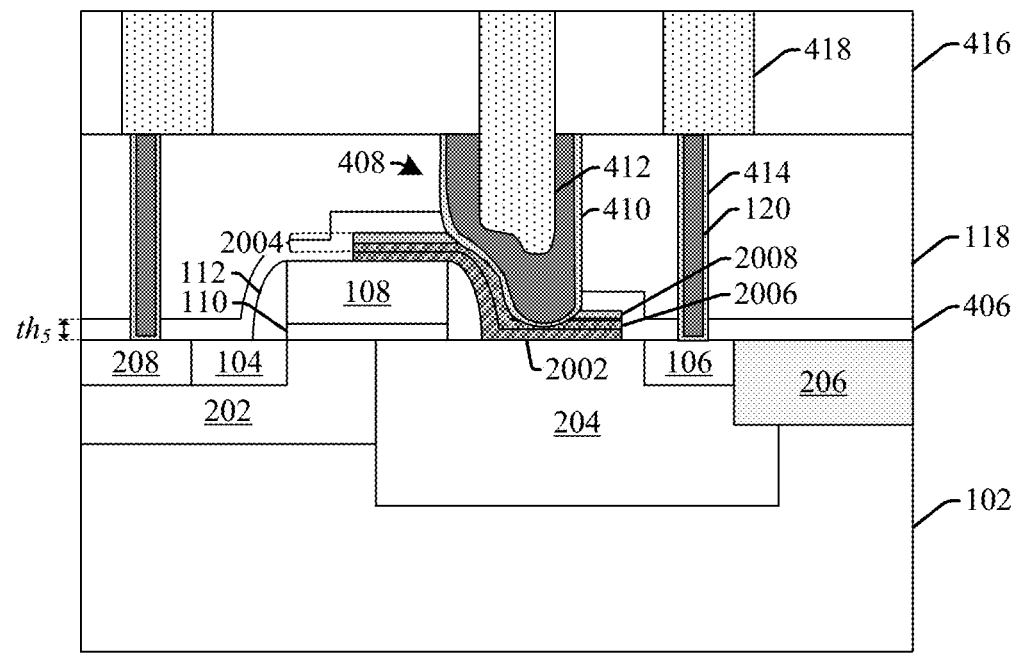

FIG. 22 illustrates a cross-sectional view of some additional embodiments of disclosed high voltage transistor device 2200 having a composite etch stop layer that defines a field plate.

The high voltage transistor device 2200 comprises a gate electrode 108 arranged over a semiconductor substrate 102. An RPO 2002 and a composite etch stop layer 2004 are over the gate electrode 108 and the semiconductor substrate 102. A contact etch stop layer (CESL) 406 is disposed over the composite etch stop layer 2004. In some embodiments, a bottom surface of the composite etch stop layer 2004 may directly contact the RPO 2002 and a top surface of the composite etch stop layer 2004 may directly contact the CESL 406. The CESL 406 laterally extends past outermost sidewalls of the composite etch stop layer 2004 and contacts the semiconductor substrate 102. In some embodiments, the CESL 406 may have a thickness $th_5$ in a range of between approximately 100 Angstroms and approximately 1000 Angstroms. In some embodiments, the CESL 406 may comprise silicon nitride, silicon carbide, or the like.

A field plate 408 is disposed within a first ILD layer 118 over the CESL 406. In some embodiments, the field plate 408 may comprise a first metal material 410 and a second metal material 412. The composite etch stop layer 2004 is laterally arranged between the field plate 408 and the gate structure 116 and vertically arranged between the field plate 122 and the semiconductor substrate 102. The RPO 2002 and the composite etch stop layer 2004 have sidewalls contacting the CESL 406. The composite etch stop layer 2004 further has horizontally extending surfaces (e.g., upper surfaces) contacting the CESL 406.

In some embodiments, the field plate 122 may extend into one or more of the plurality of different dielectric materials 2006-2008 within the composite etch stop layer 2004. For example, in some embodiments the composite etch stop layer 2004 may comprise a first dielectric material 2006 and a second dielectric material 2008 contacting upper surfaces of the first dielectric material 2006. The field plate 122 may extend through the second dielectric material 2008 (e.g., silicon oxide) and have a bottom surface contacting the first dielectric material 2006 (e.g., silicon nitride). In such embodiments, the second dielectric material 2008 may vertically separate a bottommost point of the field plate 122 from the RPO 2002. In other embodiments, the field plate 122 may further extend through the first dielectric material 2006 and have a bottom surface and/or sidewalls contacting the RPO 2002. In some embodiments, the field plate 122 may vertically extend through the second dielectric material 2008 and also be laterally separated from the gate structure 116 by the second dielectric material 2008.

Figure 23:
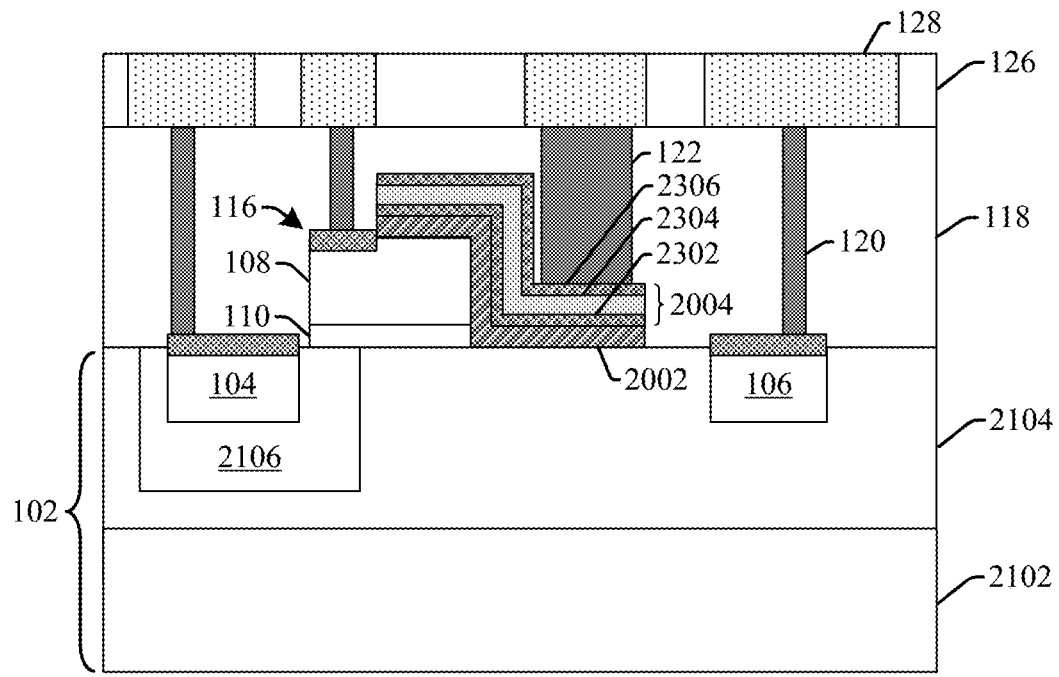
Figure 24:
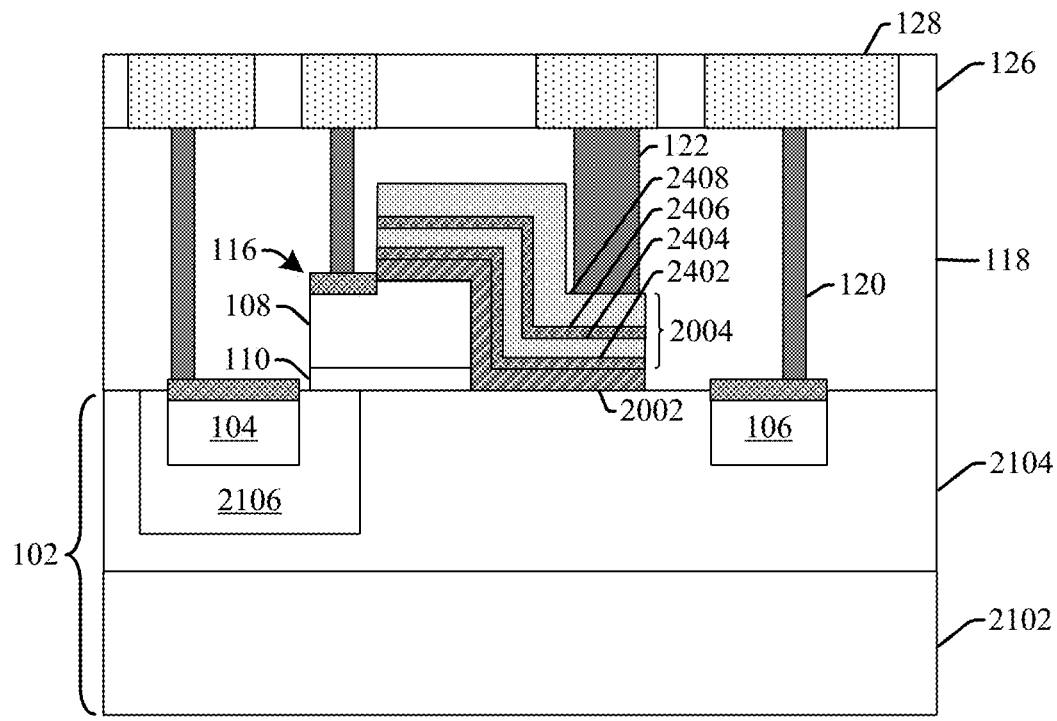

Although the disclosed composite etch stop layer 2004 is illustrated in FIGS. 20-22 as having two different dielectric materials 2006-2008 stacked over an RPO 2002, it will be appreciated that the disclosed composite etch stop layer 2004 is not limited to such configurations. Rather, in various embodiments, the composite etch stop layer 2004 may include additional layers of dielectric material. FIGS. 23-24 illustrates some non-limiting examples of alternative embodiments of a disclosed composite etch stop layer 2004.

FIG. 23 illustrates a cross-sectional view of some additional embodiments of a disclosed high voltage transistor device 2300 having a composite etch stop layer that defines a field plate.

The high voltage transistor device 2300 comprises a composite etch stop layer 2004 arranged over an RPO 2002. The composite etch stop layer 2004 comprises a first dielectric material 2302, a second dielectric material 2304 contacting an upper surface of the first dielectric material 2302, and a third dielectric material 2306 contacting an upper surface of the second dielectric material 2304. In some embodiments, the first dielectric material 2302 may comprise or be silicon dioxide ($SiO_2$), the second dielectric material 2304 may comprise or be silicon nitride ($Si_xN_y$) or silicon oxy-nitride ($SiO_xN_y$), and the third dielectric material 2306 may comprise or be silicon dioxide ($SiO_2$).

In some embodiments, the first dielectric material 2302 may have a first thickness, the second dielectric material 2304 may have a second thickness, and the third dielectric material 2306 may have a third thickness. In some embodiments, the first thickness may be in a first range of between approximately 300 Angstroms and approximately 900 Angstrom, the second thickness may be in a second range of between approximately 50 Angstroms and approximately 200 Angstrom, and the third thickness may be in a third range of between approximately 200 Angstroms and approximately 600 Angstrom.

FIG. 24 illustrates a cross-sectional view of some additional embodiments of a disclosed high voltage transistor device 2400 having a composite etch stop layer that defines a field plate.

The high voltage transistor device 2400 comprises a composite etch stop layer 2004 arranged over an RPO 2002. The composite etch stop layer 2004 comprises a first dielectric material 2402, a second dielectric material 2404 contacting an upper surface of the first dielectric material 2402, a third dielectric material 2406 contacting an upper surface of the second dielectric material 2404, and a fourth dielectric material 2408 contacting an upper surface of the third dielectric material 2406. In some embodiments, the first dielectric material 2402 may comprise or be silicon dioxide ($SiO_2$), the second dielectric material 2404 may comprise or be silicon nitride ($Si_xN_y$) or silicon oxy-nitride ($SiO_xN_y$), the third dielectric material 2406 may comprise or be silicon dioxide ($SiO_2$), and the fourth dielectric material 2408 may comprise or be silicon nitride ($Si_xN_y$) or silicon oxy-nitride ($SiO_xN_y$).

In some embodiments, the first dielectric material 2402 may have a first thickness, the second dielectric material 2404 may have a second thickness, the third dielectric material 2406 may have a third thickness, and the fourth dielectric material 2408 may have a fourth thickness. In some embodiments, the first thickness may be in a first range of between approximately 300 Angstroms and approximately 900 Angstrom, the second thickness may be in a second range of between approximately 50 Angstroms and approximately 200 Angstrom the third thickness may be in a third range of between approximately 200 Angstroms and approximately 600 Angstrom, and the fourth thickness may be in a fourth range of between approximately 50 Angstroms and approximately 200 Angstrom.

FIGS. 25-32 illustrate cross-sectional views of some embodiments showing a method of forming a high voltage transistor device having a composite etch stop layer that defines a field plate. Although the cross-sectional views 2500-3200 shown in FIGS. 25-32 are described with reference to a method, it will be appreciated that the structures shown in FIGS. 25-32 are not limited to the method but rather may stand alone separate of the method.

Figure 25:
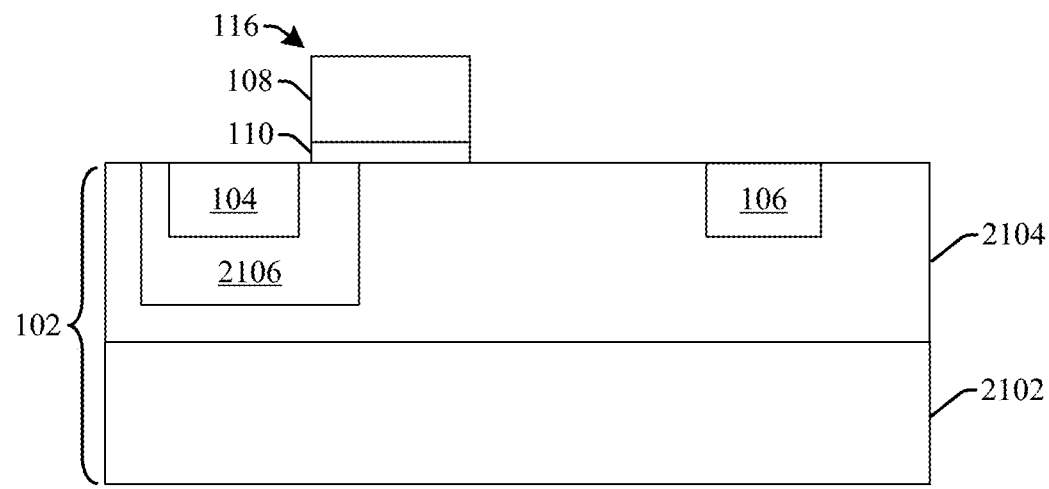
FIGS. 25-32 illustrate cross-sectional views of some embodiments showing a method of forming a high voltage transistor device having a composite etch stop layer that defines a field plate.

As shown in cross-sectional view 2500 of FIG. 25, a semiconductor substrate 102 is selectively implanted to form a plurality of implantation regions (e.g., well regions, contact regions, etc.). In some embodiments, the semiconductor substrate 102 may be selectively implanted to form a body region 2106, a drift region 2104, a source region 104, and a drain region 106. In other embodiments, the semiconductor substrate 102 may be selectively implanted to form different implantation regions (e.g., such as any of those illustrated in FIGS. 1-10). In some embodiments, the plurality of implantation regions may be formed by selectively masking the semiconductor substrate 102 (e.g., using a photoresist mask) and then introducing high-energy dopants (e.g., p-type dopant species such as boron or n-type dopants such as phosphorous) into exposed areas of the semiconductor substrate 102.

A gate structure 116 is formed over a semiconductor substrate 102 between the source region 104 and the drain region 106. The gate structure 116 may be formed by depositing a gate dielectric layer 110 over the semiconductor substrate 102, and by depositing a gate electrode material 108 over the gate dielectric layer 110. The gate dielectric layer 110 and the gate electrode material 108 may be subsequently patterned (e.g., etched according to a photoresist mask and/or a hard mask) to define the gate structure 116.

Figure 26:
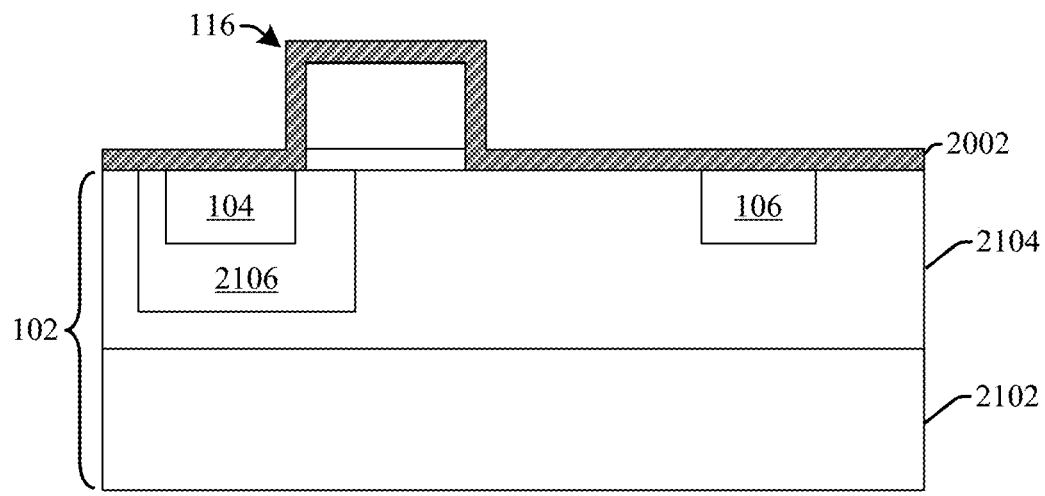

As shown in cross-sectional view 2600 of FIG. 26, a resist protective oxide (RPO) 2002 is formed over the gate structure 116. The RPO 2002 laterally extends from directly over the gate structure 116 to past an outermost sidewall of the gate structure 116. The RPO 2002 is configured to block the formation of a silicide on underlying layers. In some embodiments, the RPO 2002 may be deposited by a vapor deposition technique (e.g., CVD). In some embodiments, the RPO 2002 may comprise silicon dioxide ($SiO_2$), silicon nitride, or the like.

Figure 27:
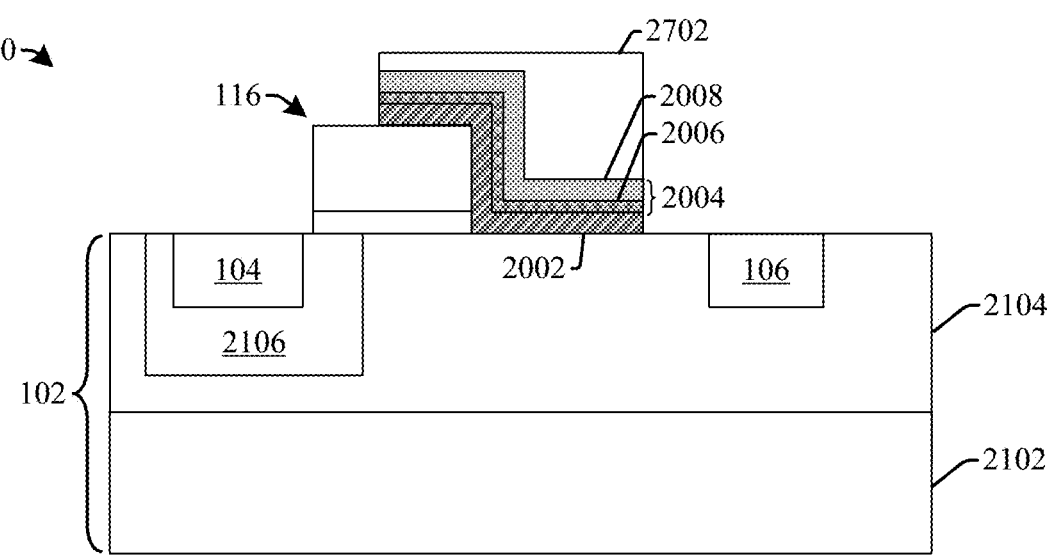

As shown in cross-sectional view 2700 of FIG. 27, a composite etch stop layer 2004 comprising a plurality of different dielectric materials 2006-2008 is selectively formed over the RPO 2002. In some embodiments, the plurality of different dielectric materials 2006-2008 may be sequentially deposited by vapor deposition techniques. In some embodiments, the composite etch stop layer 2004 may comprise stacked layers including two or more of a layer of silicon nitride ($Si_xN_y$), a layer of silicon oxy-nitride ($Si-O_xN_y$), and/or a layer of silicon dioxide ($SiO_2$).

In some embodiments, the plurality of different dielectric materials 2006-2008 and the RPO 2002 may be patterned using a same masking layer 2702 (e.g., photoresist layer) and etching process. Using a same masking layer 2702 to pattern the plurality of different dielectric materials 2006-2008 and the RPO 2002 mitigates a cost of forming the composite etch stop layer 2004. In such embodiments, the plurality of different dielectric materials 2006-2008 and the RPO 2002 may have sidewalls that are substantially aligned.

Figure 28:
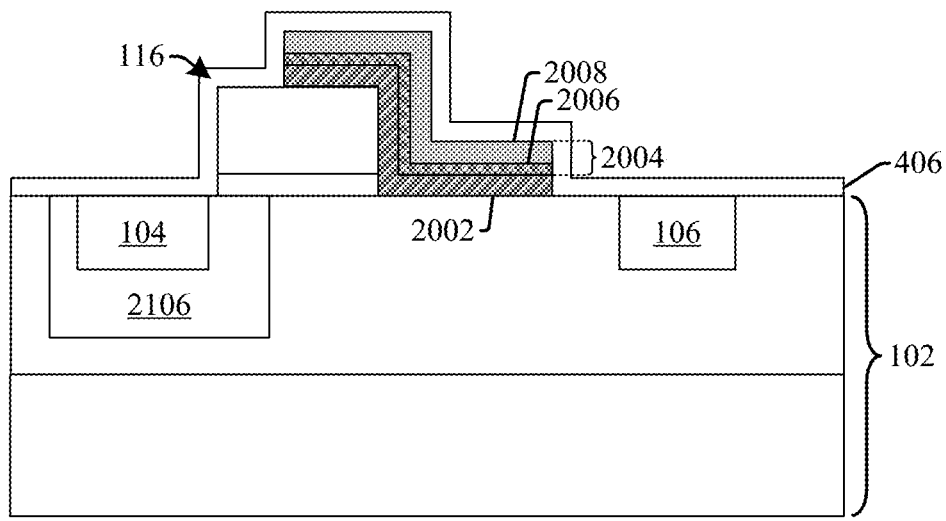

As shown in cross-sectional view 2800 of FIG. 28, a contact etch stop layer (CESL) 406 is formed over the semiconductor substrate 102 and the composite etch stop layer 2004. In some embodiments, the CESL 406 may be formed by a vapor deposition process. The CESL may comprise a nitride layer (e.g., $Si_3N_4$), a carbide layer (SiC), or the like.

Figure 29:
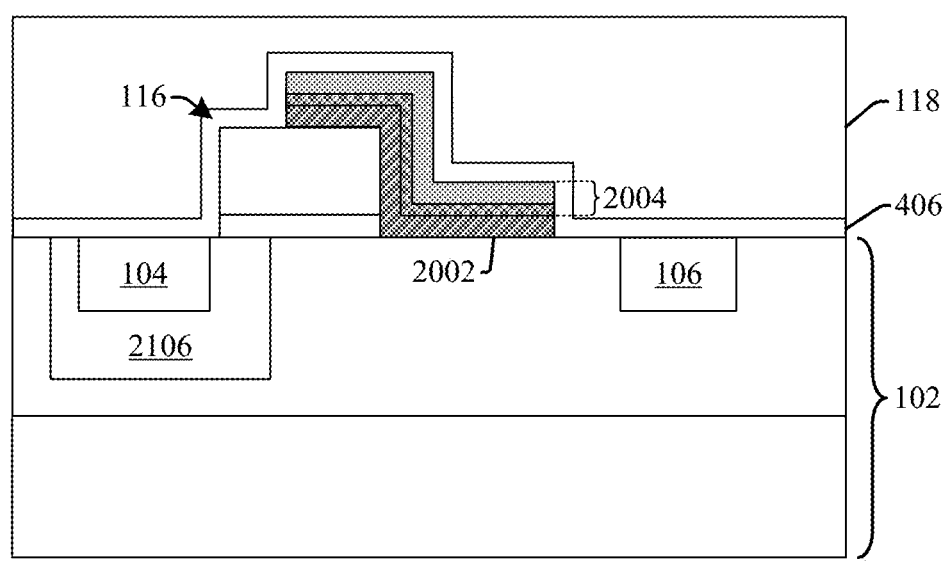

As shown in cross-sectional view 2900 of FIG. 29, a first inter-level dielectric (ILD) layer 118 is formed over the CESL 406. In some embodiments, the first ILD layer 118 may comprise an oxide (e.g., $SiO_2$), an ultra-low k dielectric material, a low-k dielectric material (e.g., SiCO), or the like. In some embodiments, the first ILD layer 118 may be formed by a vapor deposition process.

Figure 30:
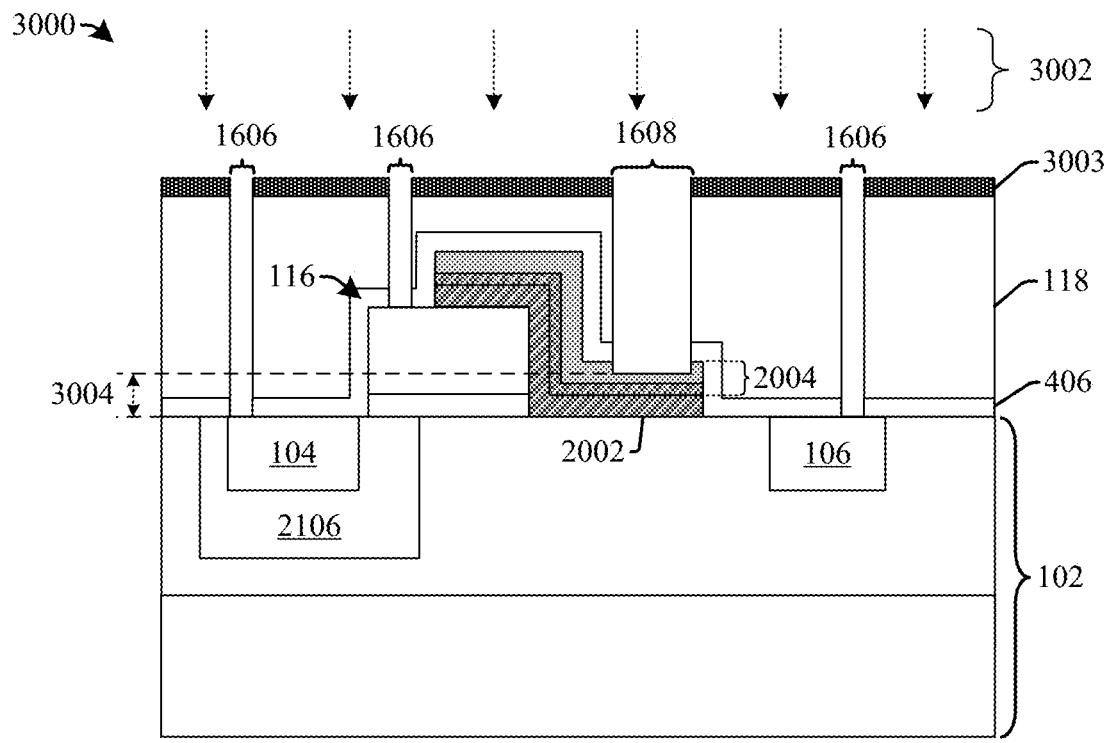

As shown in cross-sectional view 3000 of FIG. 30, the first ILD layer 118 is selectively exposed to an etchant 3002 (e.g., according to making layer 3003) to form contact openings 1606 and a field plate opening 1608 within the first ILD layer 118. The contact openings 1606 and the field plate opening 1608 have an etching depth offset of a non-zero distance 3004. In some embodiments, the non-zero distance 3004 may be in a range of between approximately 400 Angstroms and approximately 2000 Angstroms In some embodiments, the field plate opening 1608 extends into the composite etch stop layer 2004, so that sidewalls of the composite etch stop layer 2004 define the field plate opening 1608. In various embodiments, the composite etch stop layer 2004 or the RPO 2002 may define a bottom of the field plate opening 1608.

In some embodiments, the etchant 3002 may reduce a thickness of the composite etch stop layer 2004 by an amount that is in a range of between approximately 400 Angstroms and approximately 700 Angstroms. In some embodiments, a thickness of the composite etch stop layer 2004 directly below the field plate opening 1608 is in a range of between approximately 0 Angstroms and approximately 1,000 Angstroms. In some additional embodiments, a thickness of the composite etch stop layer 2004 directly below the field plate opening 1608 is in a range of between approximately 300 Angstroms and approximately 900 Angstroms.

The etchant 3002 used to form the contact openings 1608 and the field plate opening 1608 is selected to etch through a material of the CESL 406. However, because the composite etch stop layer 2004 is formed of multiple different materials, the composite etch stop layer 2004 is able to resist etching from the etchant 3002 to a higher degree. The composite etch stop layer 2004 thereby allows the contact openings 1606 to extend to the semiconductor substrate 102, while preventing the field plate opening 1608 from extending to the semiconductor substrate 102. The composite etch stop layer 2004 also allows for a high degree of uniformity in etching depths at different locations on a substrate, between substrates of a same lot, and/or over substrates of different lots. For example, the composite etch stop layer 2004 allows for the etching depth of field plate openings 1608 on different substrates to be within a deviation of approximately 2% or less. This etch depth uniformity allows for improved device uniformity and performance over devices not having the composite etch stop layer 2004.

Figure 31:
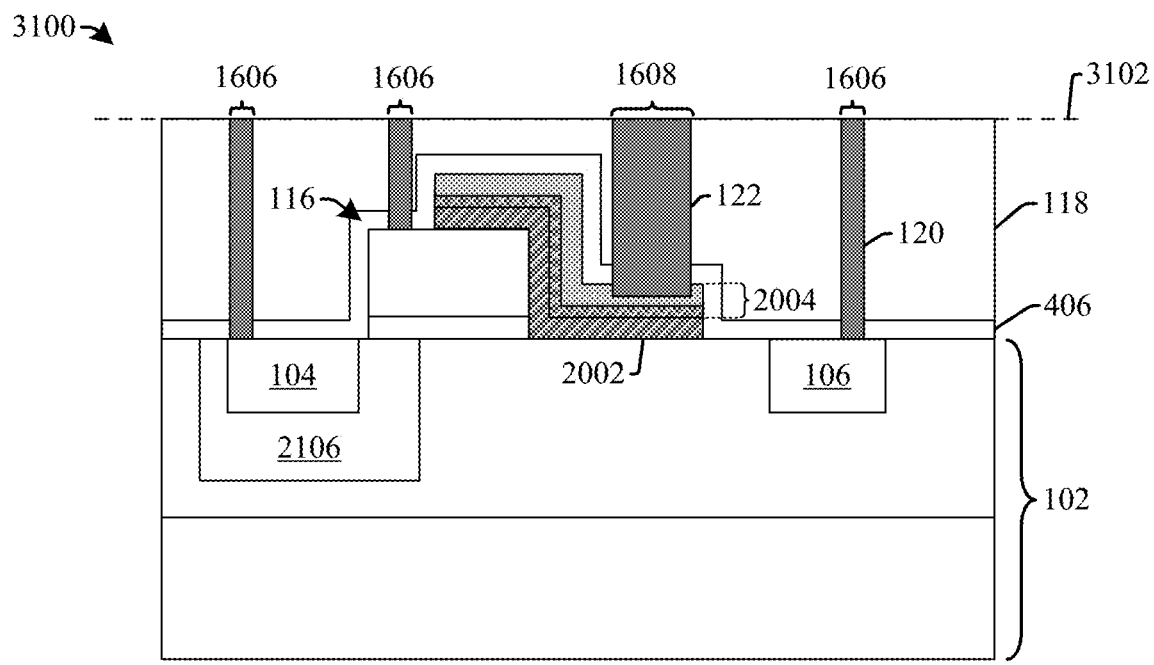

As shown in cross-sectional view 3100 of FIG. 31, the contact openings 1606 and the field plate opening 1608 are filled with one or more conductive materials. In some embodiments, the one or more conductive materials may be deposited by way of a vapor deposition technique (e.g., CVD, PVD, PE-CVD, etc.) and/or a plating process (e.g., an electroplating or electro-less plating process). A planarization process (e.g., chemical mechanical planarization) may be subsequently performed to remove excess of the one or more conductive materials and to form a planar surface along line 3102. In some embodiments, the one or more conductive materials may comprise tungsten (W), titanium (Ti), titanium nitride (TiN), and/or tantalum nitride (TaN). In some embodiments, a diffusion barrier layer and/or a liner layer may be deposited into the contact openings 1606 and the field plate opening 1608 prior to depositing the one or more conductive materials.

Figure 32:
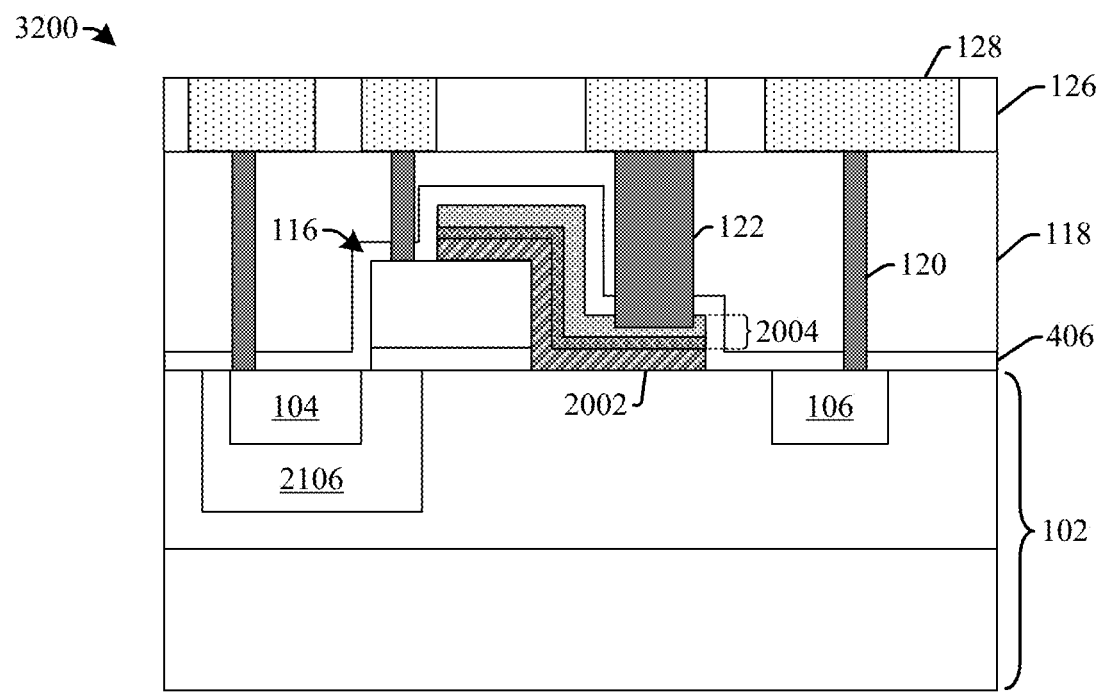

As shown in cross-sectional view 3200 of FIG. 32, a second ILD layer 126 is formed over the first ILD layer 118 and a first back-end-of-the-line (BEOL) metal wire layer 128 is formed within the second ILD layer 126. In various embodiments, the second ILD layer 126 may be formed by depositing a second ILD material over the first ILD layer 118. The second ILD layer 126 is subsequently etched to form trenches extending within the second ILD layer 126. The trenches are filled with a conductive material and a planarization process (e.g., CMP) is performed to remove excess of the conductive material from over the second ILD layer 126.

Figure 33:
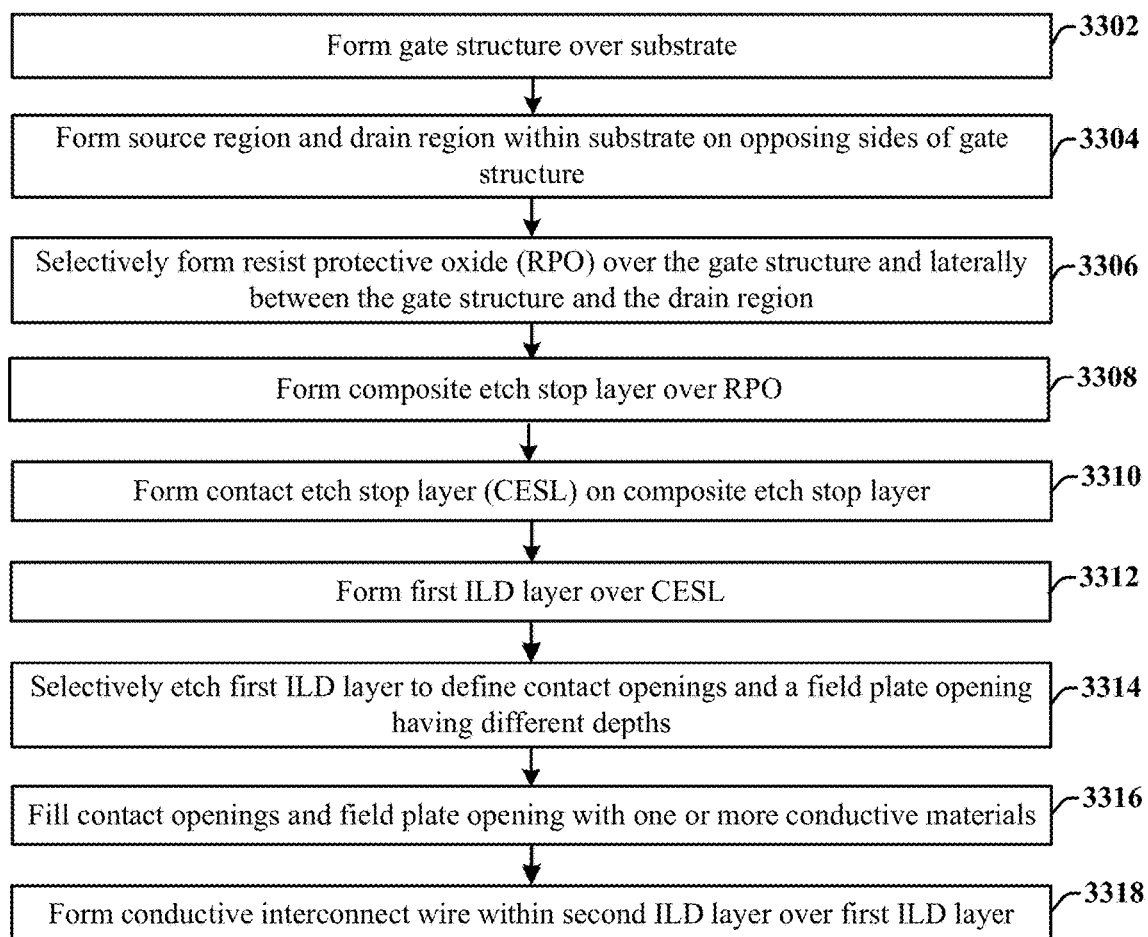
FIG. 33 illustrates a flow diagram of some embodiments of a method of forming a high voltage transistor device having a composite etch stop layer that defines a field plate.

FIG. 33 illustrates a flow diagram of some embodiments of a method 3300 of forming a high voltage transistor device having a composite etch stop layer that defines a field plate.

At 3302, a gate structure is formed over a substrate. FIG. 25 illustrates a cross-sectional view 2500 corresponding to some embodiments of act 3302.

At 3304, source and drain regions are formed within the substrate on opposing sides of the gate structure. In some additional embodiments, one or more additional doped regions (e.g., a body region, a drift region, etc.) may also be formed within the substrate. FIG. 25 illustrates a cross-sectional view 2500 corresponding to some embodiments of act 3304.

At 3306, a resist protective oxide (RPO) is formed over the gate structure and laterally between the gate structure and the drain region. FIG. 26 illustrates a cross-sectional view 2600 corresponding to some embodiments of act 3306.

At 3308, a composite etch stop layer is formed over the RPO. FIG. 27 illustrates a cross-sectional view 2700 corresponding to some embodiments of act 3308.

At 3310, a contact etch stop layer (CESL) is formed on the composite etch stop layer. FIG. 28 illustrates a cross-sectional view 2800 corresponding to some embodiments of act 3310.

At 3312, a first inter-level dielectric (ILD) layer is formed over the CESL. FIG. 29 illustrates a cross-sectional view 2900 corresponding to some embodiments of act 3312.

At 3314, the first ILD layer is selectively etched to define a plurality of contact openings and a field plate opening. The plurality of contact openings and the field plate opening have different depths. FIG. 30 illustrates a cross-sectional view 3000 corresponding to some embodiments of act 3314.

At 3316, the plurality of contact openings and the field plate opening are filled with one or more conductive materials. FIG. 31 illustrates a cross-sectional view 3100 corresponding to some embodiments of act 3316.

At 3318, a conductive interconnect wire is formed within a second ILD layer over the first ILD layer. FIG. 32 illustrates a cross-sectional view 3200 corresponding to some embodiments of act 3318.

Therefore, the present disclosure relates to a high voltage transistor device having a field plate that is formed concurrent with a formation of conductive contacts. The device has a composite etch stop layer that is used to enable differences in heights of the field plate and the conductive contacts.

In some embodiments, the present disclosure relates to an integrated chip. The integrated chip includes a gate structure disposed over a substrate between a source region and a drain region; a dielectric layer laterally extending from over the gate structure to between the gate structure and the drain region; a composite etch stop layer having a plurality of different dielectric materials stacked over the dielectric layer; a contact etch stop layer directly contacting an upper surface and sidewalls of the composite etch stop layer; and a field plate laterally surrounded by the first ILD layer and vertically extending from a top of the first ILD layer, through the contact etch stop layer, and into the composite etch stop layer. In some embodiments, the composite etch stop layer has a first dielectric material and a second dielectric material contacting an upper surface of the first dielectric material. In some embodiments, the field plate vertically extends through the second dielectric material and is laterally separated from the gate structure by the second dielectric material. In some embodiments, the first dielectric material includes silicon nitride and the second dielectric material includes silicon dioxide. In some embodiments, the first dielectric material includes silicon dioxide and the second dielectric material includes silicon nitride or silicon oxynitride. In some embodiments, the field plate vertically extends through the second dielectric material and is vertically separated from the gate structure by the first dielectric material. In some embodiments, the composite etch stop layer has a first thickness directly below the field plate and a second thickness outside of the field plate. In some embodiments, the composite etch stop layer laterally contacts sidewalls of the field plate. In some embodiments, a bottom of the field plate is vertically separated from the dielectric layer by the composite etch stop layer. In some embodiments, the dielectric layer includes a resist protective oxide having a lower surface contacting the gate structure and an upper surface contacting the composite etch stop layer.

In other embodiments, the present disclosure relates to an integrated chip. The integrated chip includes a gate structure disposed over a substrate; a resist protective oxide laterally extending from over the gate structure to past an outermost sidewall of gate structure; a composite etch stop layer having a first dielectric material over the resist protective oxide and a second dielectric material contacting an upper surface of the first dielectric material; a plurality of conductive contacts laterally surrounded by a first inter-level dielectric (ILD) layer over the substrate; and a field plate extending from a top of the first ILD layer to the composite etch stop layer and including a same material as the plurality of conductive contacts, the composite etch stop layer laterally contacting sidewalls of the field plate and vertically separating a bottom of the field plate from the resist protective oxide. In some embodiments, the field plate vertically extends through the second dielectric material and is laterally separated from the gate structure by the second dielectric material. In some embodiments, the first dielectric material is an oxide and the second dielectric material is a nitride. In some embodiments, the composite etch stop layer further comprises a third dielectric material contacting an upper surface of the second dielectric material, the first dielectric material and the third dielectric material are a same material. In some embodiments, the integrated chip further includes a contact etch stop layer directly contacting an upper surface and sidewalls of the composite etch stop layer, the field plate extending through the contact etch stop layer. In some embodiments, the resist protective oxide has a first width that is substantially equal to a second width of the composite etch stop layer.

In yet other embodiments, the present disclosure relates to method of forming an integrated chip. The method includes forming a gate structure over a substrate between a source region and a drain region within the substrate; forming a dielectric layer over the gate structure and between the gate structure and the drain region; forming a composite etch stop layer over the dielectric layer, the composite etch stop layer including a plurality of stacked dielectric materials; forming a first inter-level dielectric (ILD) layer over the composite etch stop layer; selectively etching the first ILD layer to concurrently define contact openings extending to the substrate and a field plate opening extending to the composite etch stop layer; and filling the contact openings and the field plate opening with one or more conductive materials. In some embodiments, the composite etch stop layer includes a first dielectric material and a second dielectric material contacting an upper surface of the first dielectric material. In some embodiments, the field plate opening vertically extends through the second dielectric material and is laterally separated from the gate structure by the second dielectric material. In some embodiments, the method further includes forming a masking layer over the composite etch stop layer; and etching the composite etch stop layer and the dielectric layer according to the masking layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a gate structure disposed over a substrate between a source region and a drain region;
   a dielectric layer laterally extending from over the gate structure to between the gate structure and the drain region;
   a composite etch stop layer comprising a plurality of different dielectric materials stacked over the dielectric layer;
   a contact etch stop layer directly contacting an upper surface and sidewalls of the composite etch stop layer, wherein the contact etch stop layer extends past opposing outermost sidewalls of the composite etch stop layer; and
   a field plate laterally surrounded by a first inter-level dielectric (ILD) layer and vertically extending from a top of the first ILD layer, through the contact etch stop layer, and into the composite etch stop layer, wherein the composite etch stop layer extends past opposing sides of the field plate.

2. The integrated chip of claim 1, wherein the composite etch stop layer comprises a first dielectric material and a second dielectric material contacting an upper surface of the first dielectric material.

3. The integrated chip of claim 2, wherein the field plate vertically extends through the second dielectric material and is laterally separated from the gate structure by the second dielectric material.

4. The integrated chip of claim 2, wherein the first dielectric material comprises silicon nitride and the second dielectric material comprises silicon dioxide.

5. The integrated chip of claim 2, wherein the first dielectric material comprises silicon dioxide and the second dielectric material comprises silicon nitride or silicon oxynitride.

6. The integrated chip of claim 2, wherein the field plate vertically extends through the second dielectric material and is laterally separated from the gate structure by the first dielectric material.

7. The integrated chip of claim 1,
   wherein the composite etch stop layer comprises a horizontally extending segment that protrudes outward from a sidewall of the composite etch stop layer at a position that is below a top of the gate structure; and
   wherein the horizontally extending segment of the composite etch stop layer has a first non-zero thickness directly below the field plate and a second thickness outside of the field plate, the first non-zero thickness less than the second thickness.

8. The integrated chip of claim 1,
   wherein the composite etch stop layer laterally contacts sidewalls of the field plate; and
   wherein the composite etch stop layer has a second upper surface contacting a bottommost surface of the field plate along an interface that is below one of the sidewalls of the field plate, the interface arranged along an imaginary horizontal line that is parallel to an upper surface of the substrate and that extends through sidewalls of the gate structure.

9. The integrated chip of claim 1, wherein a bottom of the field plate is vertically separated from the dielectric layer by the composite etch stop layer.

10. The integrated chip of claim 1, wherein the dielectric layer comprises a resist protective oxide having a lower surface contacting the gate structure and an upper surface contacting the composite etch stop layer.

11. The integrated chip of claim 1, wherein the composite etch stop layer laterally contacts the opposing sides of the field plate.

12. The integrated chip of claim 1, wherein the field plate comprises an outermost sidewall that extends below a topmost surface of the composite etch stop layer.

13. An integrated chip, comprising:
   a gate structure disposed over a substrate;
   a resist protective oxide laterally extending from over the gate structure to past an outermost sidewall of the gate structure;
   a composite etch stop layer having an outermost sidewall directly over the gate structure, wherein the composite etch stop layer comprises a first dielectric material over the resist protective oxide and a second dielectric material contacting an upper surface of the first dielectric material;
   a contact etch stop layer directly contacting an upper surface and opposing outermost sidewalls of the composite etch stop layer;
   a plurality of conductive contacts laterally surrounded by a first inter-level dielectric (ILD) layer over the substrate; and
   a field plate extending from a top of the first ILD layer to the composite etch stop layer and comprising a same material as the plurality of conductive contacts, wherein the field plate extends through the contact etch stop layer and wherein the composite etch stop layer laterally contacts sidewalls of the field plate and vertically separates the field plate from the resist protective oxide.

14. The integrated chip of claim 13, wherein the composite etch stop layer comprises a first material disposed along a topmost surface of the composite etch stop layer, wherein the first material has a first segment arranged completely above a top of the gate structure and a second segment completely below the top of the gate structure.

15. The integrated chip of claim 13, wherein the first dielectric material is an oxide and the second dielectric material is a nitride.

16. The integrated chip of claim 13,
   wherein the composite etch stop layer has a first thickness measured along a vertical line and at a location directly over the gate structure; and
   wherein the composite etch stop layer has a second thickness measured along a horizontal line between a sidewall of the gate structure and a sidewall of the field plate, the vertical line perpendicular to both an upper surface of the substrate and to the horizontal line, and the first thickness larger than the second thickness.

17. The integrated chip of claim 13, wherein the resist protective oxide has a first width that is substantially equal to a second width of the composite etch stop layer.

18. An integrated chip, comprising:
a gate structure disposed over a substrate between a source region and a drain region;
a dielectric layer extending from a first sidewall over the gate structure to a second sidewall between the gate structure and the drain region;
a composite etch stop layer comprising a plurality of stacked dielectric materials disposed over the dielectric layer and between the gate structure and the drain region;
a contact etch stop layer disposed along an upper surface and sidewalls of the composite etch stop layer; and
a field plate laterally surrounded by a first inter-level dielectric (ILD) layer that is over the composite etch stop layer, wherein the field plate vertically extends from a top surface of the first ILD layer, through the contact etch stop layer, and into the composite etch stop layer, wherein the composite etch stop layer has one or more interior surfaces defining a recess that is within the upper surface of the composite etch stop layer and that is directly below a bottom of the field plate, the composite etch stop layer having a non-zero thickness directly below the bottom of the field plate; and
wherein an imaginary horizontal line that is parallel to an upper surface of the substrate extends through at least one of the one or more interior surfaces and through sidewalls of both the field plate and the gate structure.

19. The integrated chip of claim 18, further comprising:
a conductive contact having opposing sidewalls that are smooth and that extend between a bottommost surface of the conductive contact and a topmost surface of the conductive contact;
wherein the field plate has a top surface that continuously extends between outermost sidewalls of the field plate; and
wherein the top surface of the field plate is substantially co-planar with the topmost surface of the conductive contact.

20. The integrated chip of claim 18,
wherein the composite etch stop layer comprises a horizontally extending segment that protrudes outward from a sidewall of the composite etch stop layer at a position that is below a top of the gate structure; and
wherein the horizontally extending segment of the composite etch stop layer has a first non-zero thickness directly below the field plate and a second non-zero thickness laterally outside of the field plate, the second non-zero thickness larger than the first non-zero thickness.

* * * * *